(12) United States Patent
Dogiamis et al.

(10) Patent No.: US 12,469,954 B2
(45) Date of Patent: Nov. 11, 2025

(54) HIGH PRECISION SCALABLE PACKAGING ARCHITECTURE BASED ON RADIO FREQUENCY SCANNING

(71) Applicant: Intel Corporation, Santa Clara, CA (US)

(72) Inventors: Georgios Dogiamis, Chandler, AZ (US); Alon Cohen, Modiin Macabim Reut (IL); Ophir Shabtay, Tzofit (IL)

(73) Assignee: Intel Corporation, Santa Clara, CA (US)

( * ) Notice: Subject to any disclaimer, the term of this patent is extended or adjusted under 35 U.S.C. 154(b) by 707 days.

(21) Appl. No.: 17/700,819

(22) Filed: Mar. 22, 2022

(65) Prior Publication Data
US 2023/0307846 A1    Sep. 28, 2023

(51) Int. Cl.
| | |
|---|---|
| *H01Q 1/22* | (2006.01) |
| *H01Q 3/46* | (2006.01) |
| *H01Q 15/14* | (2006.01) |
| *H01Q 19/10* | (2006.01) |
| *H01Q 21/08* | (2006.01) |
| *H01L 23/498* | (2006.01) |

(52) U.S. Cl.
CPC ............ *H01Q 1/2283* (2013.01); *H01Q 3/46* (2013.01); *H01Q 15/148* (2013.01); *H01Q 19/104* (2013.01); *H01Q 21/08* (2013.01); *H01L 23/49827* (2013.01); *H01L 2223/6616* (2013.01); *H01L 2223/6677* (2013.01)

(58) Field of Classification Search
CPC ............... H01Q 1/2283; H01Q 3/46; H01Q 15/14–148; H01Q 19/10; H01Q 19/104; H01L 2223/6677
See application file for complete search history.

(56) References Cited

U.S. PATENT DOCUMENTS

| | | | | |
|---|---|---|---|---|
| 6,081,235 A | * | 6/2000 | Romanofsky | H01Q 3/46 333/156 |
| 7,030,824 B1 | * | 4/2006 | Taft | H01Q 3/46 342/368 |
| 7,423,601 B2 | * | 9/2008 | Brown | H01Q 3/46 343/912 |
| 9,048,544 B2 | * | 6/2015 | Georgiadis | H01Q 3/42 |

(Continued)

FOREIGN PATENT DOCUMENTS

FR    2890792 A1    3/2007

*Primary Examiner* — Ab Salam Alkassim, Jr.
(74) *Attorney, Agent, or Firm* — Akona IP PC

(57) ABSTRACT

Embodiments of a microelectronic assembly comprise a plurality of transceiver modules, each transceiver module including a first antenna; a printed circuit board (PCB); and a reflector module coupled to the PCB and separated from the plurality of transceiver modules by a space. The reflector module comprises: a substrate having a first side and an opposing second side, the first side being proximate to the plurality of transceiver modules, an antenna-array on the first side of the substrate, the antenna-array including a plurality of second antennas; a first integrated circuit (IC) die on the second side of the substrate; and a second IC die on the second side of the substrate. The first IC die comprises radio frequency (RF) switches configured to operate at electromagnetic frequencies between 20 kHz and 1 THz, and the second IC die comprises memory cell arrays and digital logic circuits.

20 Claims, 12 Drawing Sheets

(56) References Cited

U.S. PATENT DOCUMENTS

| | | | |
|---|---|---|---|
| 2007/0090997 A1* | 4/2007 | Brown | H01Q 21/0093 |
| | | | 343/909 |
| 2012/0280380 A1* | 11/2012 | Kamgaing | H01Q 21/0093 |
| | | | 343/893 |
| 2017/0033462 A1* | 2/2017 | Clemente | H01Q 1/48 |
| 2017/0373401 A1* | 12/2017 | Visentin | H01Q 19/19 |
| 2019/0319338 A1* | 10/2019 | Gu | H01L 22/32 |
| 2020/0021342 A1* | 1/2020 | Ge | H01Q 3/46 |
| 2022/0158330 A1* | 5/2022 | Wang | H01Q 9/065 |
| 2022/0199556 A1* | 6/2022 | Zhou | G06F 13/14 |
| 2022/0407215 A1* | 12/2022 | Zinck | H01Q 15/14 |
| 2023/0144206 A1* | 5/2023 | Dogiamis | H01Q 1/526 |
| | | | 257/774 |
| 2023/0208029 A1* | 6/2023 | Zhang | H01Q 3/36 |
| | | | 342/372 |
| 2023/0420396 A1* | 12/2023 | Acikalin | H01L 23/66 |
| 2024/0038691 A1* | 2/2024 | Khanolkar | H01L 24/96 |
| 2024/0243472 A1* | 7/2024 | Novak | H01Q 15/148 |
| 2025/0087604 A1* | 3/2025 | Vincent | H01L 24/48 |
| 2025/0174891 A1* | 5/2025 | Clemente | H01Q 3/34 |

\* cited by examiner

HIGH PRECISION SCALABLE PACKAGING ARCHITECTURE BASED ON RADIO FREQUENCY SCANNING

TECHNICAL FIELD

The present disclosure relates to techniques, methods, and apparatus directed to a high precision scalable packaging architecture based on radio frequency (RF) scanning.

BACKGROUND

Electronic circuits when commonly fabricated on a wafer of semiconductor material, such as silicon, are called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
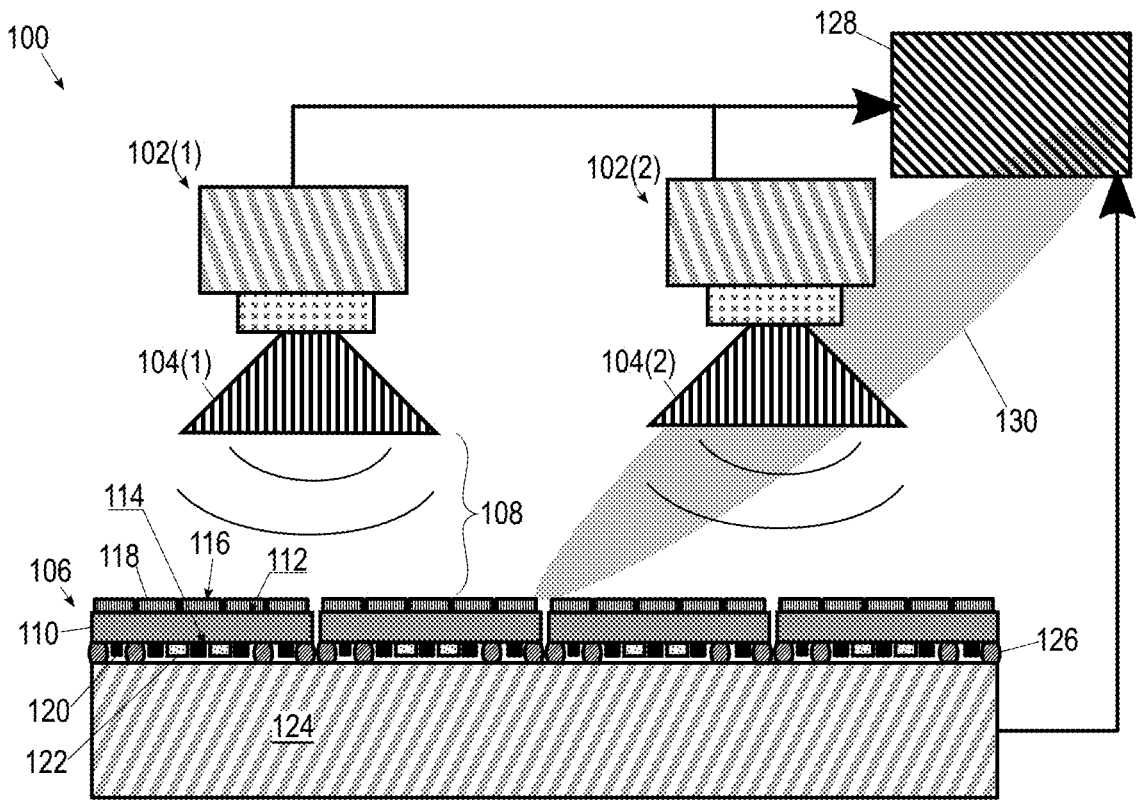
FIG. 1 is a schematic cross-sectional view of an example microelectronic assembly according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

RF semiconductors are used in the telecommunication, aerospace, automotive, and defense fields in addition to the consumer market, which is experiencing an increasing demand for consumer devices and autonomous systems. The range of circuits that employ RF semiconductors includes phase shifters, attenuators, couplers, filters, amplifiers, switches, oscillators, and antenna tuners. Materials used in manufacturing RF semiconductors include gallium arsenide (GaAs), gallium nitride (GaN), silicon (Si), and silicon carbide (SiC). These materials are significant in electronic circuits such as RF filters, RF power amplifiers, RF low-noise amplifiers, and RF switches (among others); different materials and associated processing techniques can change the speed and frequency characteristics of RF circuits, which in turn can determine appropriate applications for such RF circuits.

Silicon-based RF ICs can offer mixed-mode (e.g., analog and digital) and digital circuitry on the same semiconductor chip using advanced processes such as bipolar complementary metal-oxide semiconductor (BiCMOS) process, which produces RF bipolar devices (e.g., bipolar junction transistors (BJT)) and low power digital Complementary Metal-Oxide Semiconductor (CMOS) devices (e.g., CMOS gates) on the same chip. Examples of advanced processes, structures, and materials for RF integrated CMOS devices include various BiCMOS processes, high transition frequency (fT) FinFETs, high maximum operational frequency (fmax) FinFETs, RF silicon-on-insulator (SOI) planar devices, heterojunction bipolar transistor (HBT), and silicon germanium (SiGe) HBT. Typically, in terms of area, SiGe HBT circuits occupy one-quarter to one-third the area of CMOS circuits of equivalent functionality; in dense caches as in a microprocessor, CMOS circuits occupy one-quarter to one-third of the area of BJT circuits for the same functionality.

In general, CMOS refers to a semiconductor manufacturing process in which electronic devices are fabricated on the surface of a semiconductor substrate by implantation. The problem with the CMOS process is that the substrate is not insulating enough for RF devices; passive components have very poor performance and coupling through the substrate can cause serious degradation in RF device performance. Thus, in devices integrating RF switches and digital switches, various processing and design techniques have to be employed to enable seamless operation in the same physical domain of the IC. For example, layout techniques such as matching, guard rings, and isolation trenches have to be employed to minimize substrate loss and coupling. Other examples include extra thick metals, metal-insulator-metal capacitors, and a higher substrate resistivity. These enhancements ease some of the design challenges but lead to extra mask levels and more process steps. Indeed, the close integration of digital and analog functions requires a wide range of design tools to be integrated into a single design environment. The design of such fully integrated RF IC transceivers is so complex, and the design cycle so short, that intellectual property (IP) transfer and partnerships between design houses, foundries and consumer product manufacturing companies have become an important business strategy. Thus, it is advantageous to dissociate RF devices from digital circuitry, such as in high-bandwidth memory (HBM), enabling the widely different functionalities (i.e., RF and digital) to be realized on separate ICs with corresponding manufacturing processes appropriately tailored for the respective functionalities.

Further, systems incorporating RFICs are used in imaging platforms, for example, where RF electromagnetic waves are used to scan the environment and create a map thereof. Such existing RF systems include, by way of examples, millimeter wave multiple-input multiple-output (MIMO) radar phased array systems, low frequency reflectarray systems with mechanical scanning, and millimeter wave to sub-THz reflectarray systems with on-chip antennas with electronic scanning capabilities. Millimeter wave MIMO phased array systems are difficult to scale to thousands of antennas. Power and cost rise linearly with the amount of transmission (Tx) and receiving (Rx) channels. Such systems suffer from reduced isolation of multiple Tx/Rxs. Heavy digital signal processing (DSP) needed in such systems increase the cost of silicon area, complexity, and power. Other challenges include routing congestion, phase synchronization for a large aperture, and RF signal distribution losses.

Reflectarray systems known in the art are typically made using diodes for switches (phase shifters) that introduce high power consumption (in some cases greater than 10 A) as well as high insertion loss (e.g., much greater than 3 dB per diode). Mechanical reflectarrays that perform beam steering using mechanical means are bulky, slow and heavyweight for use in automotive and other consumer applications. Although sub-THz reflectarrays are powerful, the overall silicon area utilized is greater than about 3000 mm$^2$ for a 10000-element array which leads to higher cost. Moreover, a single feed architecture can result in about 5-6 cm overall height of the system. The size of the system also depends on the memory needed to implement the beamforming algorithm in the same IC as the RF metal-oxide semiconductor field-effect transistors (MOSFET) switch (e.g., phase shifter), therefore increasing the area needed of the RF chip.

Accordingly, embodiments of the present disclosure provide a microelectronic assembly comprising a plurality of transceiver modules, each transceiver module including a feeding antenna; a printed circuit board (PCB); and a reflector module coupled to the PCB and separated from the plurality of transceiver modules by a space, the reflector module comprising: a substrate having a first side and an opposing second side, the first side being proximate to the plurality of transceiver modules, a reflectarray on the first side of the substrate, the reflectarray including a plurality of receiving antennas; and an RF IC die and a memory IC die on the second side of the substrate. The PCB is coupled to the reflector module on the second side of the substrate also. The receiving antennas are coupled to the RF IC die by at least one of wired connections and wireless connections in the substrate, the RF IC die is coupled to the memory IC die by conductive traces in the substrate, the RF IC die comprises RF switches configured to operate at electromagnetic frequencies between 20 kHz and 1 THz, and the memory IC die comprises memory cell arrays and digital logic circuits.

Such a microelectronic assembly using reflectarrays and advanced packaging and assembly techniques can improve performance of RF systems (e.g., imaging platforms) to less than 1 degree beamwidth in azimuth and elevation radial co-ordinates and a sidelobe level to greater than 50 dB, while achieving high isolation and scalability to greater than 10000 antenna elements. The system may also reduce the cost of existing solutions (e.g., millimeter wave MIMO radar phased array systems, low frequency reflectarray systems with mechanical scanning, sub-THz reflectarray systems with on-chip antennas) by using high efficiency antennas in organic, ceramic or glass substrates, thereby reducing silicon area needed for on-chip antennas of existing solutions. Such systems may also improve performance of existing phased array systems by introducing a scalable chiplet-based approach and may reduce the footprint and height (e.g., thickness) of existing reflectarray systems by using a multi-feed architecture.

In such a microelectronic assembly, antennas are moved away from the silicon chip into the substrate, for example, to improve performance (e.g., greater than 4× higher efficiency compared to existing technologies) and therefore reduce the silicon area needed and associated costs. Memory needed is also moved out of the RF switch dies and implemented on a deeply scaled node. Such a move may allow for lower power consumption by the memory, lower total silicon area (e.g., benefits from node scaling) while decoupling the digital intensive circuitry (e.g., memory) from the RF high-performance circuitry (e.g., MOSFET high transition frequency (fT) switches). Decoupling the digital circuitry from the RF IC allows independent optimization of the two separate dies, for example permitting even higher fT switches by employing gallium nitride (GaN) or indium phosphide (InP) transistors in the RF IC die, or by reducing total silicon area by greater than 5-10 times. Further, by using a multi-feed architecture with a plurality of transceiver modules, the footprint and height (e.g., thickness) of the microelectronic assembly can be reduced compared to existing reflectarray systems.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type pr P-type materials. Dies may include, for example, a crystalline base material formed using a bulk silicon (or other bulk semiconductor material) or a SOI structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., MOSFETs. In general, a FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides, including optical fiber, optical splitters, optical combiners, optical couplers, and optical vias.

The term "waveguide" refers to any structure that acts to guide the propagation of light from one location to another location typically through a substrate material such as silicon or glass. In various examples, waveguides can be formed from silicon, doped silicon, silicon nitride, glasses such as silica (e.g., silicon dioxide or $SiO_2$), borosilicate (e.g., 70-80 wt % $SiO_2$, 7-13 wt % of $B_2O_3$, 4-8 wt % $Na_2O$ or $K_2O$, and 2-8 wt % of $Al_2O_3$) and so forth. Waveguides may be formed using various techniques including but not limited to forming waveguides in situ. For example, in some embodiments, waveguides may be formed in situ in glass using low temperature glass-to-glass bonding or by laser direct writing. Waveguides formed in situ may have lower loss characteristics.

The term "conductive trace" may be used to describe an electrically conductive element isolated by an insulating material. Within IC dies, such insulating material comprises interlayer low-k dielectric that is provided within the IC die. Within package substrates, and PCBs such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In context of a stack of dies coupled to one another or in context of a die coupled to a package substrate, the term "interconnect" may also refer to, respectively, die-to-die (DTD) interconnects and die-to-package substrate (DTPS) interconnects. DTD interconnects may also be referred to as first-level interconnects (FLI). DTPS interconnects may also be referred to as Second-Level Interconnects (SLI).

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be bare (e.g., unpackaged) dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple subelements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Note that in the figures, various components (e.g., interconnects) are shown as aligned (e.g., at respective interfaces) merely for ease of illustration; in actuality, some or all of them may be misaligned. In addition, there may be other components, such as bond pads, landing pads, metallization, etc. present in the assembly that are not shown in the figures to prevent cluttering. Further, the figures are intended to show relative arrangements of the components within their assemblies, and, in general, such assemblies may include other components that are not illustrated (e.g., various interfacial layers or various other components related to optical functionality, electrical connectivity, or thermal mitigation). For example, in some further embodiments, the assembly as shown in the figures may include more dies along with other electrical components. Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

Figure 10:
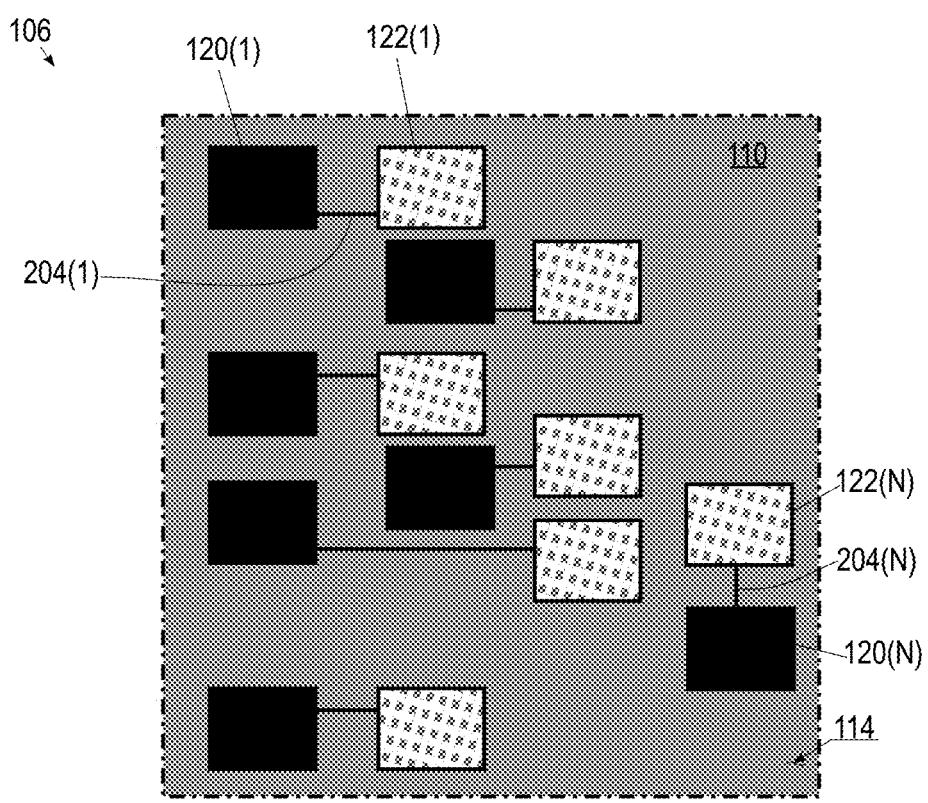
FIG. 10 is a schematic bottom view of an example microelectronic assembly according to some embodiments of the present disclosure.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 112a-112e), such a collection may be referred to herein without the letters (e.g., as "112").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

EXAMPLE EMBODIMENTS

FIG. 1 is a schematic cross-sectional view of an example microelectronic assembly 100 according to some embodiments of the present disclosure. Microelectronic assembly 100, comprises, in the embodiment shown, a plurality of transceiver modules 102, e.g., 102(1) and 102(2), each transceiver module 102 including a respective antenna 104, e.g., 104(1) and 104(2), respectively. Antenna 104 may comprise any suitable type, for example, slot antenna, leaky-wave antenna, patch antenna, stacked patch antenna, horn antenna (e.g., conical, pyramidal, sectoral), and dipole/monopole antenna within the broad scope of the embodiments. In various embodiments, antenna 104 comprises a feeding antenna, i.e., a source of electromagnetic waves. In some embodiments, antennas 104 in the plurality of transceiver modules 102 may comprise phased array antennas, for example, to increase gain of each transceiver module 102. In such embodiments, each antenna 104 may comprise an array of smaller antennas, for example, 4×4 array or 5×5 array. Transceiver modules 102 may comprise various additional components not shown, such as RF transceiver circuits in IC dies, PCBs for supplying power, ground connections, power supplies, passive components, waveguide feeds, synchronization signal connections, and mechanical fixtures for holding antenna 104 in place. The circuits used in transceiver module 102 may be fabricated on IC dies using any suitable process that meets design considerations, such as CMOS, FinFETs process, RF-silicon-on-insulator (RF-SOI) process, GaN process, or InP process. A typical footprint size of transceiver module 102 may be less than 2 mm×2 mm. In particular embodiments, transceiver modules 102 may radiate (e.g., transmit and receive) electromagnetic energy in the terahertz range.

Microelectronic assembly 100 further includes a reflector module 106 separated from the plurality of transceiver modules 102 by a space 108. Space 108, comprising a distance between antenna 104 and reflector module 106 may depend on the number of transceiver modules 102. For example, space 108 in microelectronic assembly 100 having four transceiver modules 102 may be half that of another microelectronic assembly 100 having one transceiver module 102. In some embodiments, antenna 104 may be codesigned with reflectarray 116 for optimum illumination coverage and to ensure a spherical field profile of the RF electromagnetic radiation that impinges on a surface of reflectarray 116. When using multiple transceiver modules 102, each would illuminate a smaller area of reflectarray 116 and hence may be brought closer to reflectarray 116 in order to maintain a good aperture efficiency and small spillover to neighboring antennas 118 outside the sphere of illumination. Reducing space 108 may be desirable to reduce total thickness of microelectronic assembly 100. However, as the number of transceiver modules 102 increases, complexity of algorithms to control them for providing phased RF electromagnetic waves/signals increases so that it is not efficient to increase the number of transceiver modules 102 beyond a reasonable limit. In general, microelectronic assembly 100 having a reflector module 106 of a particular area (e.g., footprint) will have a larger number of transceiver modules 102 than another microelectronic assembly 100 having a reflector module 106 of lesser area.

Reflector module 106 comprises a substrate 110 having a first side 112 and an opposing second side 114, first side 112 being proximate to transceiver modules 102. A reflectarray 116, including a plurality of antennas 118, is on first side of substrate 110. In some embodiments, antennas 118 are arranged in a regular array numbering more than 10,000. Each of antennas 118 may be of any type, including slot antenna, leaky-wave antenna, patch antenna, stacked patch antenna, horn antenna, and dipole/monopole antenna. Each antenna 118 of reflector module 106 may be smaller than each antenna 104 of transceiver module 102. Dimensions (e.g., length, width) of antennas 118 may be based on the wavelength of the RF electromagnetic waves used in operations and the type of antenna. For example, in embodiments where antennas 118 are patch antennas, they are square shaped, with a length (or width) equal to one-fourth the wavelength of the RF electromagnetic waves that they operate on. In some embodiments, an identical pitch of about half wavelength is maintained among antennas 118. Various other components, such as ground planes, microstrip lines, capacitors, connecting wires, slot-lines, near-field coupling structures, etc. may be included in substrate 110; such components are not shown so as not to clutter the drawings. For example, each antenna 118 may be backed by a ground plane, which may reflect the incident electromagnetic wave from antenna 104 toward the direction of a beam.

Substrate 110 may comprise any suitable material sufficient to provide structural support for reflectarray 116. In some embodiments, substrate 110 may comprise glass; in some other embodiments, substrate 110 may comprise ceramic; in yet other embodiments, substrate 110 may comprise organic dielectric materials, for example, similar to materials (e.g., silica-filled buildup epoxy film, polyimide, epoxy) used in a PCB or conventional package substrate.

One or more RF IC die 120 and memory IC die 122 are coupled to second side 114 of substrate 110. RF IC die 120 and a memory IC die 122 may be coupled to substrate 110 by suitable interconnects not shown so as not to clutter the drawings. The interconnects may be any kind, including solder, adhesive, or other types, as described in reference to DTD interconnects and DTPS interconnects in the previous section. In various embodiments, RF IC die comprises RF switches configured to operate at electromagnetic frequencies between 20 kHz and 1 THz, and manufactured using semiconductor fabrication processes suitable for RF devices. Different RF switches have different mechanical and electrical structures, which in turn affect their operating characteristics such as switching speed, isolation, insertion loss, and return loss. Common RF switches, including those used in embodiments of microelectronic assembly 100 may comprise one or more of solid-state switches, including FET switches and Positive Intrinsic Negative (PIN) switches. For example, in some embodiments, RF IC die 120 may comprise low-loss high transition frequency transistors that function as switches for phase shifting, and fabricated using high-performance RF processes. In different embodiments, RF IC die 120 may be fabricated using one of CMOS FinFET process, CMOS planar process, RE-SOI process, GaN process, or InP process. The particular process chosen may be driven by system requirements (e.g., performance) and maximum frequency of operation. In various embodiments, RF IC die 120 may range in size from 100×100 um to 300×300 um. In other embodiments, RF IC die 120 may be larger than 300 mm×300 mm. In some other embodiments, RF IC die 120 may be 1 mm×1 mm. Assembly of such sub-mm$^2$ IC dies may utilize advanced pick-and-place techniques or batch assembly techniques known in the art.

Memory IC die 122 comprises memory cell arrays and digital logic circuits and is fabricated using a process different from that used to make RF IC die 120. For example, memory IC die 122 may be fabricated using bulk CMOS processes. In various embodiments, memory IC dies 122 may be fabricated using high-performance digital process, for example, to benefit from device scaling and reduced power consumption. In some embodiments, memory IC die 122 may further include communication logic circuits (e.g., serial peripheral interface, scan chain circuits, etc.), for example, to ensure memory read-write (R/W) operation and to potentially perform calibrations. By decoupling RF functionalities from digital functionalities, high-bandwidth/capacity memory chips that are not limited by RF manufacturing processes can be integrated in microelectronic assembly 100.

In addition, because transistors made using RF processes are typically larger than those made for digital circuits in CMOS processes, transistors in RF IC die 120 may be larger than transistors in memory IC die 122. In some embodiments, transistors in RF IC die 120 may be made of different materials than transistors in memory IC die 122. From a functional perspective, transistors in RF IC die 120 comprise RF switches configured to operate at electromagnetic frequencies between 20 kHz and 1 THz, and transistors in memory IC die 122 comprise part of memory arrays and digital logic circuits. In particular embodiments, each RF IC die 120 may comprise as few as two transistors (e.g., for two different phases of a particular one of antenna 118) whereas memory IC die 122 may comprise a memory array storing as many as 100,000 phase combinations (e.g., 1 phase per antenna for 10,000 antennas times 10 for correction/calibration across different frequencies and other stored algorithms for performance enhancement).

Decoupling antennas 118 from RF IC die 120 may enable a size of reflector module 106 based on considerations other than IC die size or IC die fabrication processes. For example, a size (e.g., area) of reflector module 106 may vary according to the number of transceiver modules 102, number of antennas 118, amount of warpage of substrate 110 that can be accommodated without performance degradation, processing and handling considerations in case of glass substrate, etc., unrelated to the number of RF IC dies 120.

Reflector 106 may be coupled to a PCB 124 on second side 114 of substrate 110 by interconnects 126. Interconnects 126 may comprise solder-based interconnects, such as solder balls in ball grid arrays, or soldered pins in land grid arrays, etc. In a general sense, a pitch between adjacent interconnects at the interface between substrate 110 and RF IC die 120 (or memory IC die 122), for example, may be smaller than the pitch between adjacent ones of interconnects 126.

Microelectronic assembly 100 may also comprise various other components, such as a baseband processor IC die 128 conductively (e.g., electrically) coupled to transceiver modules 102 and to PCB 124. In some embodiments, baseband processor IC die 128 may be affixed on PCB 124; in other embodiments, baseband processor IC die 128 may be affixed to another component electrically wired to PCB 124 and to transceiver modules 102. In various embodiments, baseband processor IC die 128 may comprise a microcontroller; in other embodiments, baseband processor IC die 128 may be coupled to a separate microcontroller.

During transmitting operation, each antenna 104 may transmit an RF signal toward reflector module 106. Each antenna 104 may illuminate a portion of reflectarray 116 such that all antennas 104 may together illuminate all antennas 118. The RF signal is reflected into a beam 130 by beamforming. In a general sense, beamforming is a signal processing technique for directional signal transmission or reception by combining reflections from individual antennas (e.g., 118) in an array (e.g., 116) in such a way that signals at particular angles experience constructive interference while others experience destructive interference. For example, in some embodiments, saw-tooth-like phase distribution terms are applied on antennas 118 to focus wavefronts from antenna 104 into a high precision beam 130. The phase of a particular antenna 118 may introduce a time delay in the reflected signal from such antenna 118. Such a phase distribution may be required to account for varying path lengths from antenna 104 to each antenna 118. In some embodiments, a progressive phase shift may be applied to antennas 118 to steer the beam direction. In embodiments where reflectarray 116 comprises an electronically scanned array, baseband processor IC die 128 may provide instructions to RF IC die 120 to enable creating a beam of radio frequency electromagnetic waves that can be electronically steered to point in different directions without physically moving antennas 118.

In an example embodiment, based on the instructions from baseband processor IC die 128, RF IC die 120 configures a phase state of each antenna 118 with a phase shifter, for example, comprising a one-bit phase shifter corresponding to values of 0 degrees and 180 degrees (i.e., two phase states). In some embodiments, the phase of each antenna 118 may be related to the incident angle or phase of the electromagnetic wave radiated from transceiver module 102; the quantized phase may enable reflector module 106 to refocus the incident electromagnetic wave in a different direction. In some embodiments, each antenna 118 may correspond to one bit in a memory array stored in memory IC die 122. In some embodiments, RF IC die 120 may access the memory array in memory IC die 122 and may control the phase state of antenna 118 accordingly. In some other embodiments, RF IC die 120 may comprise another memory array that is smaller than the memory array of memory IC die 122; such smaller memory array may be used to asynchronously load data from memory IC die 122; during operation, the smaller memory array be accessed for changing phase states of antennas 118. In various embodiments, the smaller memory array may comprise data relevant to the particular RF IC die 120, for example, containing data for only those antennas 118 that it is coupled to. In embodiments where antennas 118 number in the thousands (e.g., 10,000), the processing gain achieved by decoupling RF and digital functionalities can overcome any quantization noise of the one-bit phase shifter. In some embodiments, each line in the memory array is related to one state of a corresponding antenna 118 in reflectarray 116. In some embodiments, a two-bit phase shifter may be used, which can store values corresponding to four phase states of antenna 118.

In various embodiments, each line in the memory array may also comprise relevant code to switch beam 130 to a different direction, such that sequentially reading by RF IC die 120 from line to line in the memory array may generate beamforming scanning of a specific area. In some embodiments, such code may be loaded asynchronously into the smaller memory array of RF IC die 120 as appropriate. In some embodiments, bits in each memory cell of the memory array are read out sequentially and cyclically to control the antenna phase shift for raster-scan imaging. Per each direction, the signal transmitted by transceiver module 102 and reflected by reflector module 106 is a chirp signal with a bandwidth that is related to a desired range resolution (e.g., speed of light divided by twice the bandwidth). In some embodiments, the same beam 130 is transmitted by scanning cyclically, allowing support for Doppler reconstruction. During reflection operation, reflected beam 130 from objects in the environment impinge on reflectarray 106 and are focused into antennas 104 of transceiver modules 102. These reflected signals carry the information of the 3D scene to be mapped. Baseband processor IC die 128 and/or circuits in transceiver module 102 may process the received beam 130, each section in time being related to reflection from specific direction. Algorithms may be executed to extract a target range of angles in each direction. A fast fourier transform (FFT) may be implemented on the scanning repetition dimension such that at the output of the FFT, a range Doppler map per each direction may be obtained.

In a particular embodiment used on an imaging platform, microelectronic assembly 100 may take measurements called radiation patterns, which describe the angular direction in which antennas 118 is radiating energy. Microelectronic assembly 100 may focus the energy precisely, for example, generating a reflected beam that is one degree wide, and steer that beam in steps of one degree, for example, according to the phase of each one of antennas 118. The one-degree-wide beam can move in a zigzag pattern over each point in a scene and create a three-dimensional (3D) depth image. Unlike other terahertz arrays, which can take hours or even days to create an image, embodiments of microelectronic assembly 100 can generate 3D images in real-time. Particular embodiments of microelectronic assembly 100 may be used in imaging platforms in self-driving autonomous vehicles, autonomous drones, security settings such as enabling a non-intrusive body scanner that could work in seconds instead of minutes and other such applications.

Figure 2:
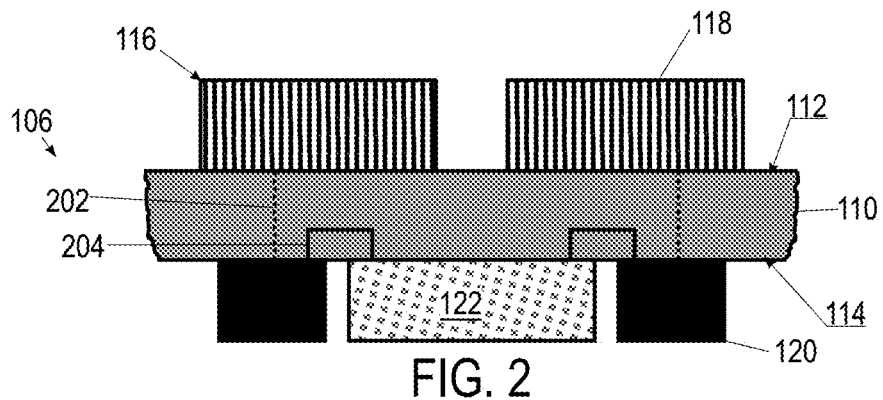
FIG. 2 is a schematic cross-sectional view of a portion of an example microelectronic assembly according to some embodiments of the present disclosure.

FIG. 2 is a schematic cross-sectional view of a portion of reflector module 106 in an example microelectronic assembly 100 according to some embodiments of the present disclosure. In the example embodiment shown in the figure, antennas 118 extend beyond first side 112 of substrate 110. Antennas 118 are coupled to RF IC die 122 by communicative pathways 202 in substrate 110, and RF IC die 122 is coupled to memory IC die 120 by conductive traces 204 in substrate 110. In various embodiments, communicative pathways 202 may be conductive (e.g., wired) or non-conductive (e.g., wireless). In embodiments where communicative pathways 202 comprise conductive (e.g., wired) connections extending between first side 112 and second side 114 of substrate 110, such conductive connections may couple antennas 118 with RF IC die 120 suitably. Communicative pathway 202 in such embodiments may comprise any electrically conductive material such as copper, and may include various shapes and structures, including vias, lines, traces, pads, etc. known in the art. In some embodiments where communicative pathways 202 comprise wireless connections, communicative pathways 202 may also comprise conductive traces in substrate 110 that do not physically contact antenna 118; instead, such conductive traces act as short-range near-field coupled (e.g. wireless) structures communicating with antennas 118 appropriately. In various embodiments, conductive traces 204 may comprise copper. Any electrically conducting material may be used in conductive traces 204 within the broad scope of the embodiments herein.

Note that communicative pathways 202 and conductive traces 204 shown in the figure are merely representative; each one of communicative pathways 202 or conductive traces 204 as shown in the figure may comprise any number of individual communicative pathways or conductive traces (e.g., communicative pathway 202 may comprise at least two communicative pathways, one for each phase of antenna 118). In some embodiments (e.g., as shown), each antenna 118 may be coupled to a separate one of RF IC die 120. In some other embodiments (not shown), more than one antenna 118 may be coupled to a separate RF IC die 120 in a many-to-one correspondence.

Figure 3:
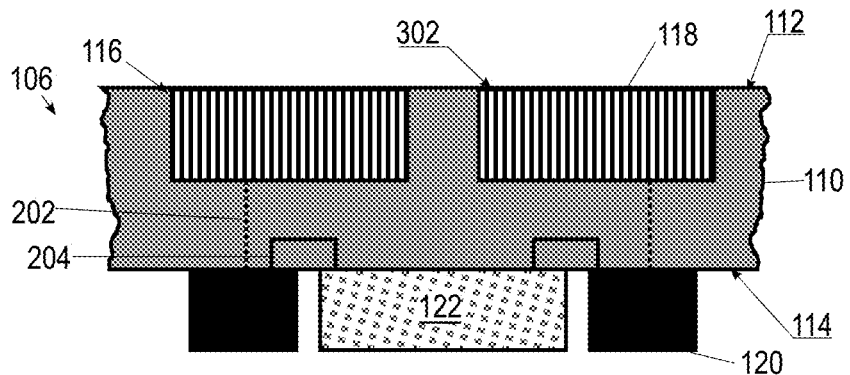
FIG. 3 is a schematic cross-sectional view of a portion of an example microelectronic assembly according to some embodiments of the present disclosure.

FIG. 3 is a schematic cross-sectional view of a portion of reflector module 106 in an example microelectronic assembly 100 according to some embodiments of the present disclosure. In the example embodiment shown, antennas 118 are embedded in substrate 110 such that surfaces 302 of antennas 118 (e.g., proximate to transceiver module 102) are approximately coplanar with first side 112 of substrate 110. In embodiments where substrate 110 is transparent to the electromagnetic radiation, first side 112 may extend beyond surfaces 302.

Figure 4:
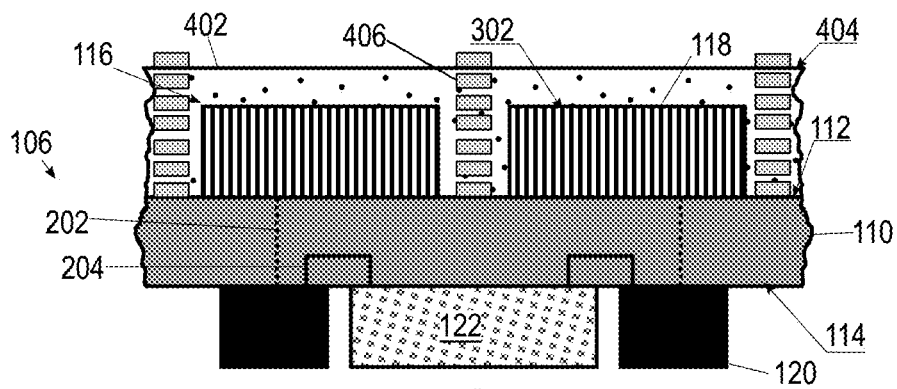
FIG. 4 is a schematic cross-sectional view of a portion of an example microelectronic assembly according to some embodiments of the present disclosure.

FIG. 4 is a schematic cross-sectional view of a portion of reflector module 106 in an example microelectronic assembly 100 according to some embodiments of the present disclosure. In the example embodiment shown, reflector module 106 further comprises a coating 402) on first side 112 of substrate 110. Coating 402 may comprise epoxy in some embodiments. In other embodiments, coating 402 may comprise glass. In yet other embodiments, coating 402 may comprise the same material as substrate 110. Coating 402 may act as a protective barrier, protecting surfaces 302 of antennas 118 from abrasion, particulates, etc. Coating 402 may be transparent to the electromagnetic radiation transmitted by antenna 104. In some embodiments, surface 404 of coating 402 may be flush with surfaces 302 of antennas 118. In other embodiments (as shown), surface 404 may be between transceiver module 102 and surfaces 302 of antennas 118. In some embodiments shielding structures 406 (e.g., metallic vias, bars, periodic metallic structures) between neighboring antennas 118 may be created inside and on the surface of coating 402.

Figure 5:
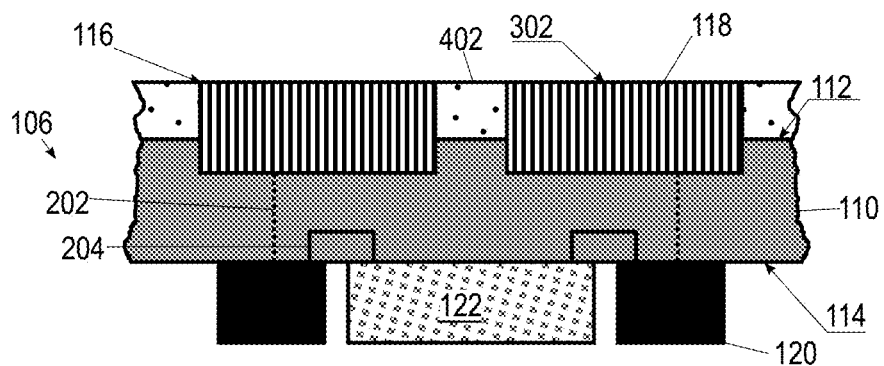
FIG. 5 is a schematic cross-sectional view of a portion of an example microelectronic assembly according to some embodiments of the present disclosure.

FIG. 5 is a schematic cross-sectional view of a portion of reflector module 106 in an example microelectronic assembly 100 according to some embodiments of the present disclosure. In some embodiments (as shown), surface 404 of coating 402 may be flush (e.g., coplanar) with surfaces 302 of antennas 118. In some embodiments, a portion of each antenna 118 may be within substrate 110, and another portion of antenna 118 may be outside substrate 110. In yet other embodiments, (not shown), coating 402 may be a conformal coating, following contours of antennas 118 over substrate 110.

Figure 6:
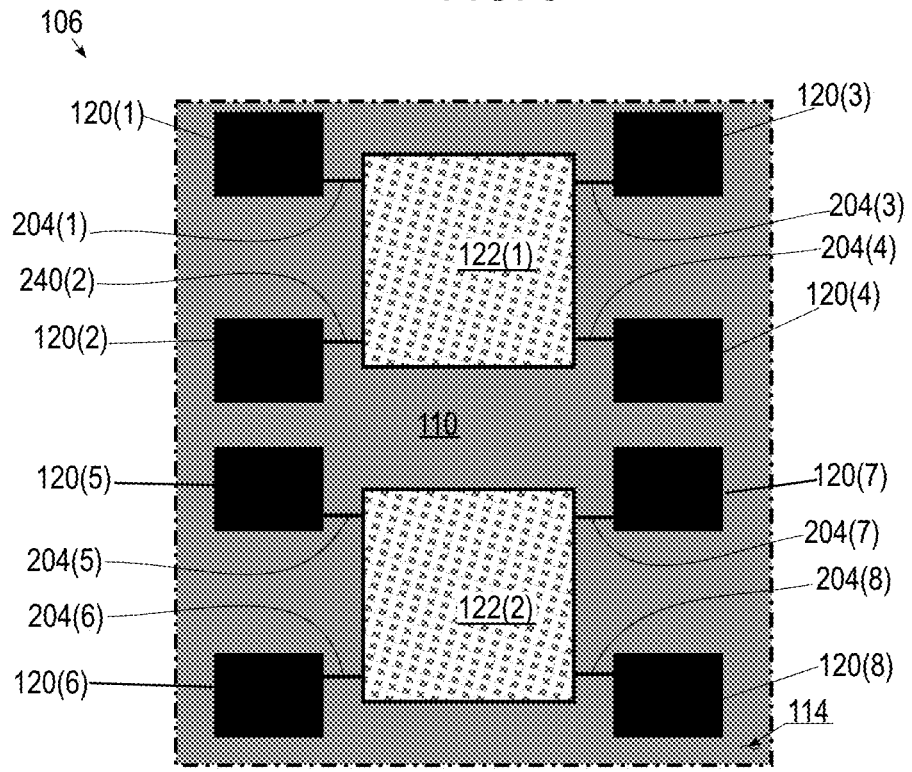
FIG. 6 is a schematic bottom view of an example microelectronic assembly according to some embodiments of the present disclosure.

FIG. 6 is a schematic bottom view of a portion of reflector module 106 in an example microelectronic assembly 100 according to some embodiments of the present disclosure. The figure shows second side 114 of substrate 110 on which RF IC dies 120 and memory IC dies 122 are coupled. Microelectronic assembly 100 may comprise a plurality of RF IC dies 120 and another plurality of memory IC dies 122. A subset of the plurality of RF IC dies 120 may be coupled to a separate one of memory IC dies 122 in a many-to-one correspondence. In such embodiments, the number of memory IC dies 122 may be reduced from another embodiment where each antenna 118 or RF IC die 120 is associated with a separate memory IC die 122. Each RF IC die 120 may be coupled to one antenna 118 in a one-to-one correspondence, or to a plurality of antennas 118 in a many-to-one correspondence in various embodiments.

In the example embodiment shown, two memory IC dies 122 are coupled to eight RF IC dies 120 by separate conductive traces 204. For example, RF IC dies 120(1)-120(4) are coupled to memory IC die 122(1) by separate conductive traces 204(1)-204(4) respectively; likewise, RF IC dies 120(5)-120(8) are coupled to memory IC die 122(2) by separate conductive traces 204(5)-204(8) respectively. The figure is merely illustrative and is not to be interpreted as a limitation; microelectronic assembly 100 may comprise any number of RF IC dies 120 and memory IC dies 122, each memory IC die 122 being coupled to any number of RF IC dies 120 within the broad scope of the embodiments.

Figure 7:
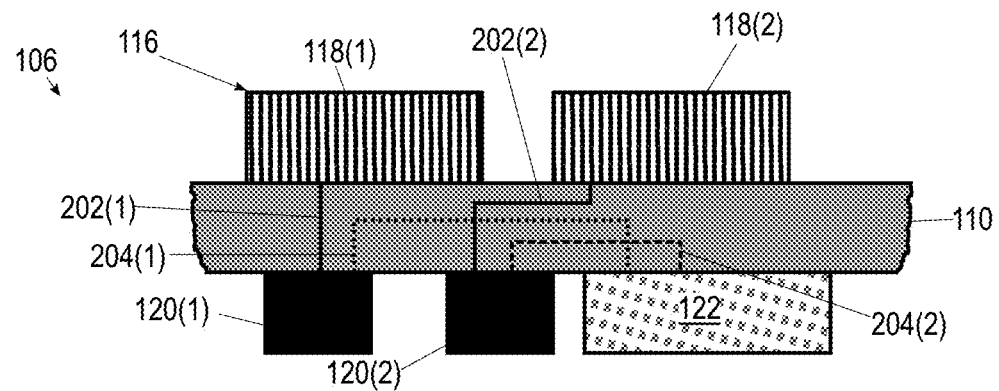
FIG. 7 is a schematic cross-sectional view of a portion of an example microelectronic assembly according to some embodiments of the present disclosure.

FIG. 7 is a schematic cross-sectional view of a portion of reflector module 106 in an example microelectronic assembly 100 according to some embodiments of the present disclosure. In various embodiments, each antenna 118 may be coupled to a separate one of RF IC die 120, whereas more than one RF IC die 120 may be coupled to a single memory IC die 122. For example, antenna 118(1) may be coupled to RF IC die 120(1) by communicative pathway 202(1), antenna 118(2) may be coupled to RF IC die 120(2) by communicative pathway 202(2), whereas RF IC dies 120(1) and 120(2) may be coupled by separate conductive traces 204(1) and 204(2) respectively to common memory IC die 122. Note that only two RF IC dies 120 and antennas 118 are shown in the figure merely for illustrative purposes; microelectronic assembly 100 may have any number of antennas 118 and RF IC dies 120 (among other components) within the broad scope of the embodiments. Likewise, any number of RF IC dies 120 may be coupled to a single one of memory IC die 122 within the broad scope of the embodiments.

Figure 8:
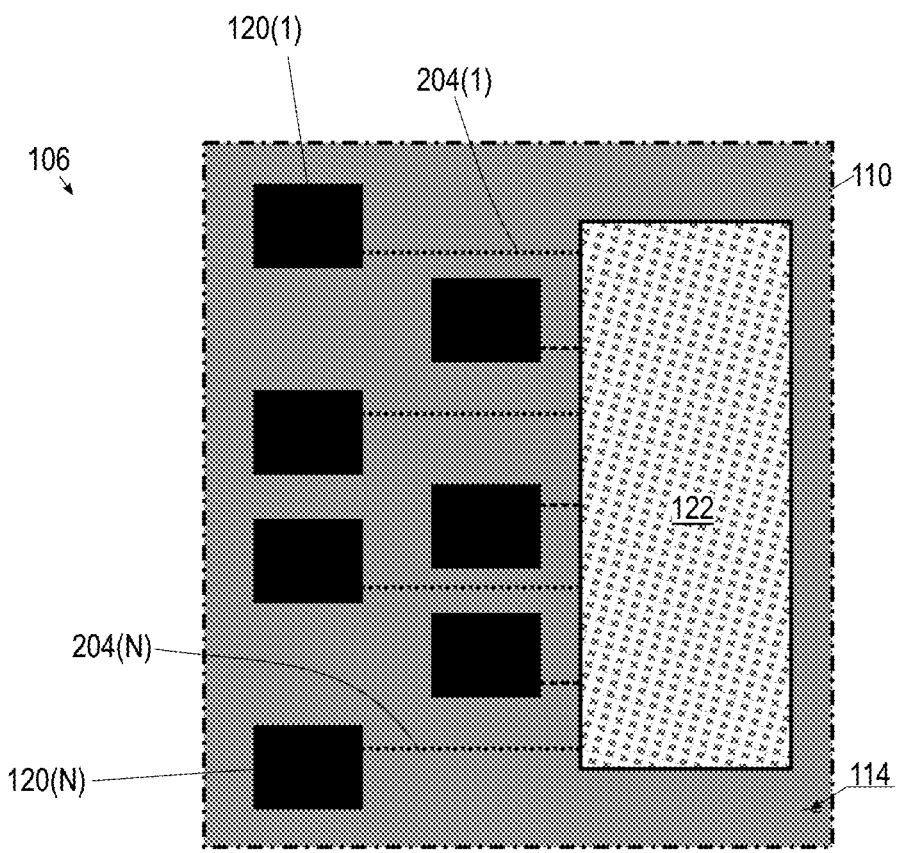
FIG. 8 is a schematic bottom view of an example microelectronic assembly according to some embodiments of the present disclosure.

FIG. 8 is a schematic bottom view of a portion of reflector module 106 in an example microelectronic assembly 100 according to some embodiments of the present disclosure. A plurality of RF IC dies 120(1), 120(2), . . . 120(N) may be coupled to a single memory IC die 122 on second side 114 of substrate 110. In some embodiments, microelectronic assembly 100 may have only one memory IC die 122 to which all RF IC dies 120 are coupled in a many-to-one correspondence; in other embodiments, microelectronic assembly 100 may have more than one memory IC die 122 and subsets of RF IC dies 120 may be coupled to separate ones of memory IC dies 122.

Figure 9:
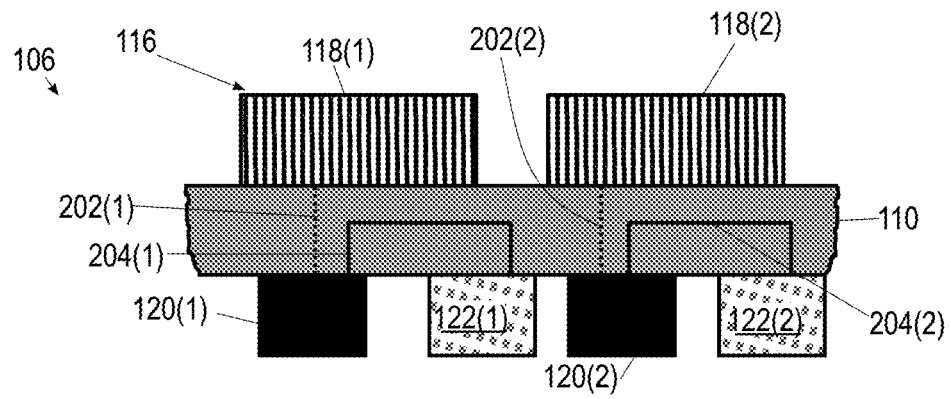
FIG. 9 is a schematic cross-sectional view of a portion of an example microelectronic assembly according to some embodiments of the present disclosure.

FIG. 9 is a schematic cross-sectional view of a portion of reflector module 106 in an example microelectronic assembly 100 according to some embodiments of the present disclosure. In some embodiments, RF IC dies 120 may be coupled to memory IC dies 122 in a one-to-one correspondence; likewise, antennas 118 and RF IC dies 120 may be coupled in a one-to-one correspondence. Thus, for example, in the figure shown, antenna 118(1) is coupled to RF IC die 120(1) in a one-to-one correspondence; RF IC die 120(1) is coupled to memory IC die 122(1) in a one-to-one correspondence; likewise, antenna 118(2) is coupled to RF IC die 120(2), which is coupled to memory IC die 122(2).

FIG. 10 is a schematic bottom view of a portion of reflector module 106 in an example microelectronic assembly 100 of the previous figure. In the embodiment shown, microelectronic assembly 100 may comprise a plurality of RF IC dies 120 and memory IC dies 122; each one of RF IC dies 120 is coupled to a separate one of memory IC dies 122.

Figure 11:
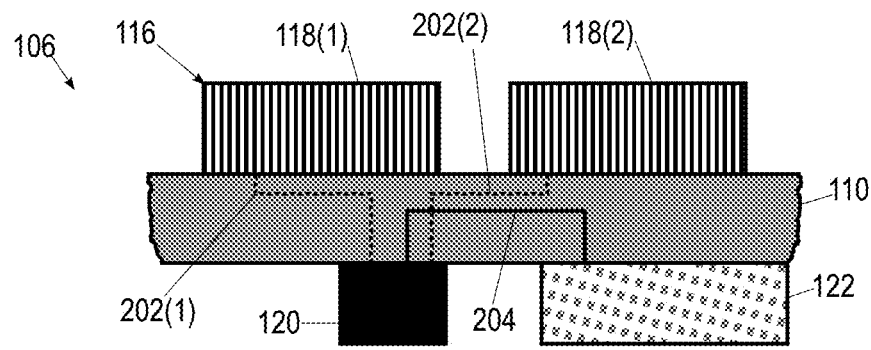
FIG. 11 is a schematic cross-sectional view of a portion of an example microelectronic assembly according to some embodiments of the present disclosure.

FIG. 11 is a schematic cross-sectional view of a portion of reflector module 106 in an example microelectronic assembly 100 according to some embodiments of the present disclosure. A subset of antennas 118 may be coupled to a separate one of RF IC die 120 in a many-to-one correspondence. A different subset of RF IC dies 120 may be coupled to a separate one of memory IC die 122 in a many-to-one correspondence. For example, antennas 118(1) and 118(2) may be coupled by separate communicative pathways 202(1) and 202(2) respectively to RF IC die 120. RF IC die 120 may be coupled by conductive trace 204 to memory IC die 122.

Figure 12:
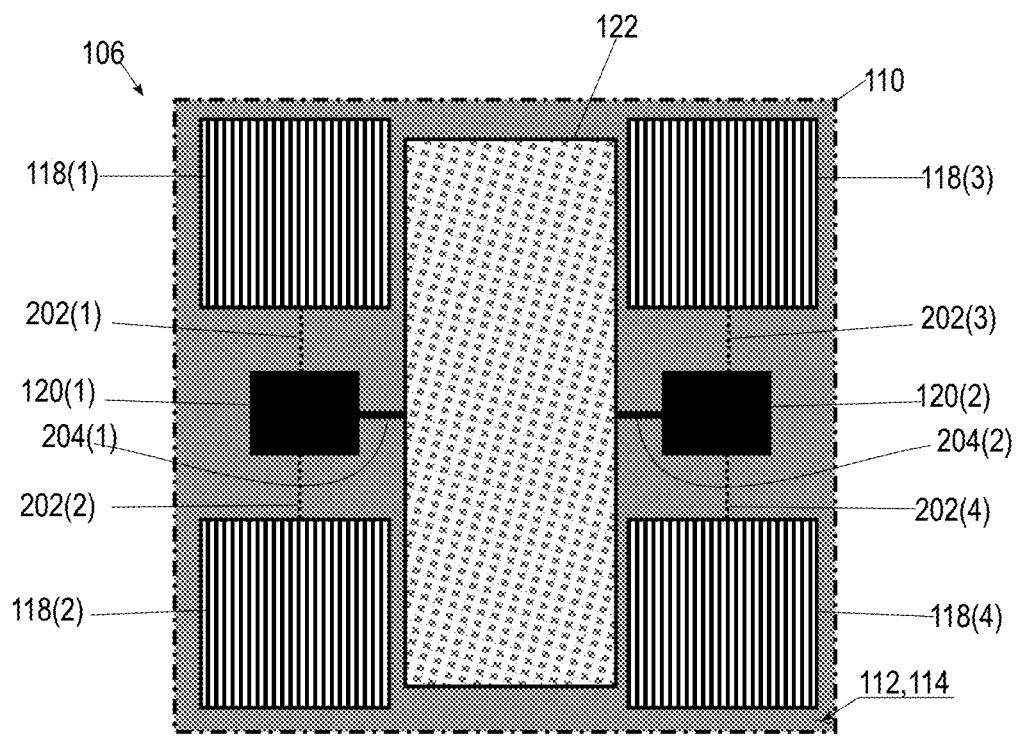
FIG. 12 is a schematic plane view of a portion of an example microelectronic assembly according to some embodiments of the present disclosure.

FIG. 12 is a schematic plane view of a portion of reflector module 106 in an example microelectronic assembly 100 according to some embodiments of the present disclosure. In the figure, although antennas 118 are on a different surface than RF IC dies 120 and memory IC die 122, they are shown flattened in a single plane for ease of explanation and not as a limitation. In a physical embodiment, substrate 110 separates antennas 118 from RF IC dies 120 and memory IC die 122. A subset of antennas 118, for example, 118(1) and 118(2) may be coupled to a separate one of RF IC die 120, for example, 120(1) in a many-to-one correspondence by respective communicative pathways 202(1) and 202(2). Another subset of antennas 118, for example, 118(3) and 118(4) may be coupled to a separate one of RF IC die 120, for example, 120(2) in a many-to-one correspondence by respective communicative pathways 202(3) and 202(4). A different subset of RF IC dies 120, for example, RF IC dies 120(1) and 120(2) may be coupled to a separate one of memory IC die 122 in a many-to-one correspondence by respective conductive traces 204(1) and 204(2). In such embodiments, RF IC die 120 and memory IC die 122 may be larger than their counterparts in other embodiments, for example, as shown in FIG. 10.

Figure 13:
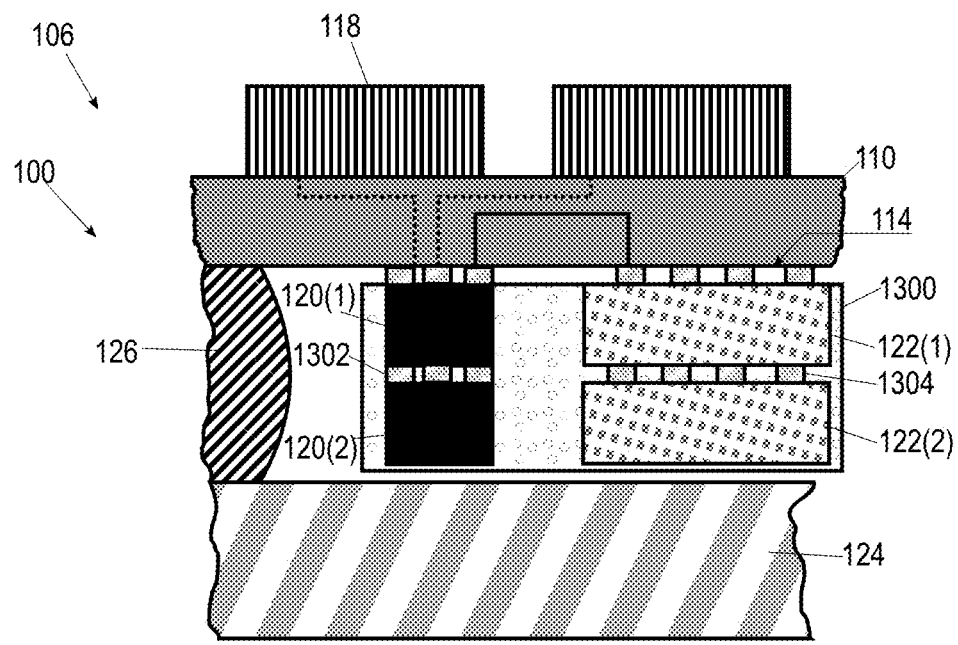
FIG. 13 is a schematic cross-sectional view of a portion an example microelectronic assembly according to some embodiments of the present disclosure.

FIG. 13 is a schematic cross-sectional view of a portion of reflector module 106 in an example microelectronic assembly 100 according to some embodiments of the present disclosure. In some embodiments (e.g., as shown), one or more RF IC dies 120 and one or more memory IC dies 122 may be packaged together in a single package 1300. In the example embodiment shown, RF IC dies 120 are shown stacked one on top of another with interconnects 1302 therebetween and memory IC dies 122 are shown stacked one on top of another with interconnects 1304 therebetween. In various embodiments, interconnects 1302 and 1304 may be of similar size, shape and pitch; in other embodiments, interconnects 1302 and 1304 may be different from each other. In some embodiments, interconnects 1302 and 1304 may comprise DTD interconnects, for example, hybrid bonds comprising metal-metal and oxide-oxide bonds, or in another example, solder-based interconnects. In other embodiments, RF IC dies 120 and memory IC dies 122 may be coupled to a package substrate laterally, and such package 1300 may be coupled to substrate 110 using suitable interconnects. In some such embodiments, appropriate bond pads of multi-chip package 1300 (e.g., coupled to particular RF IC dies 120) may be coupled to antennas 118 by communicative pathways 202 and by through-substrate vias (TSVs) in the stacked RF IC dies 120; electrical connections between RF IC dies 120 and memory IC dies 122 may be accommodated within multi-chip package 1300. In other embodiments, communicative pathways 202 between antennas 118 and RF IC dies 120 and conductive traces 204 between RF IC dies 120 and memory IC dies 122 may be provisioned in substrate 110. In such embodiments having stacked ones of RF IC dies 120 and/or memory IC dies 122, a total thickness of multi-chip package 1300 may be smaller than a thickness of interconnects 126 between substrate 110 and PCB 124. In other words, there is a gap between multi-chip package 1300 and PCB 124.

Other variations are also included within the broad scope of the embodiments. For example, in various embodiments (not shown), a plurality of RF IC dies 120 may be packaged into a single RF multi-chip package; likewise, a plurality of memory IC dies 122 may be packaged into a single memory multi-chip package, and the RF multi-chip package and the memory multi-chip package may be coupled to second side 114 of package substrate 110. In some embodiments, only RF IC dies 120 may be packaged together, whereas memory IC dies 122 may be coupled directly to substrate 110. In other embodiments, only memory IC dies 122 may be packaged together, whereas RF IC dies 120 may be coupled directly to substrate 110. In yet other embodiments, RF IC dies 120 may be packaged into many multi-chip packages, as also memory IC dies 122.

Figure 14:
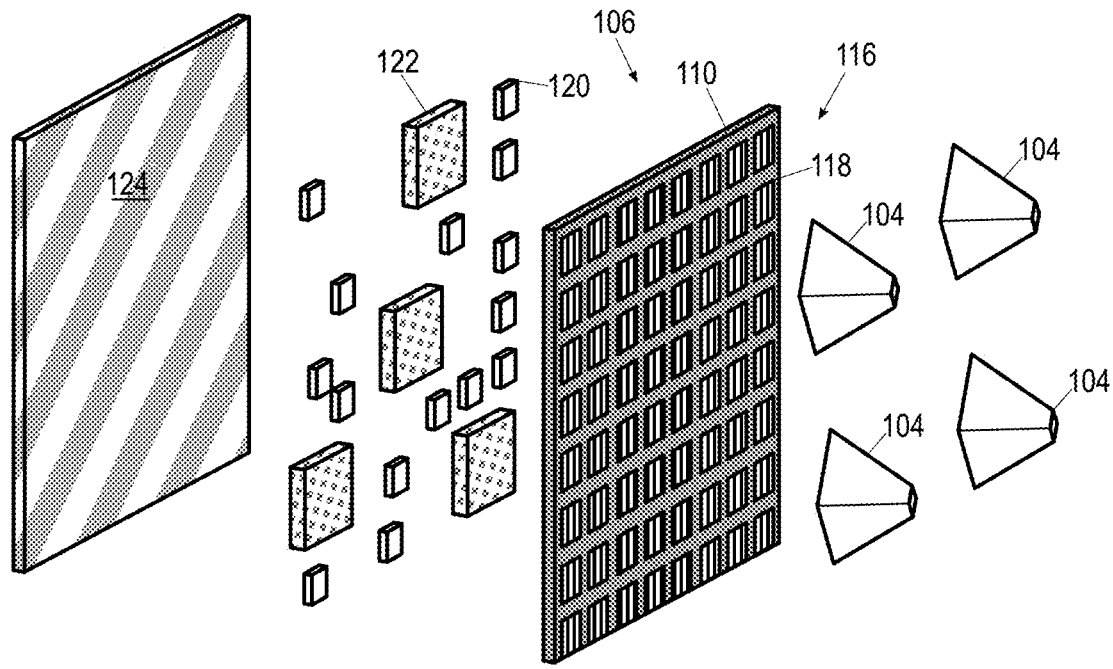
FIG. 14 is a schematic exploded perspective view of a portion of an example microelectronic assembly according to some embodiments of the present disclosure.

FIG. 14 is a schematic exploded perspective view of a portion of an example microelectronic assembly 100 according to some embodiments of the present disclosure. Note that the figure does not show any electrical or mechanical coupling between the different components merely for ease of illustration and explanation and the figure is not to be interpreted literally. Transceiver modules 102 may be located in front of reflector module 106. In the figure, four pyramidal horn antennas 104 of transceiver module 102 are shown merely for illustrative purposes and are not meant as limitations. Any number and type of antennas 104 may be included in microelectronic assembly 100 within the broad scope of the embodiments. In some embodiments, transceiver modules 102 may also include waveguide feeds coupled to appropriate electronic components such that antennas 104 can send out electromagnetic waves of desired frequency and amplitude (e.g., chirp signals) toward reflector module 106. For example, one end of each waveguide feed may face reflector module 106 and the other end may be coupled to electronic components of transceiver modules 102. In a general sense, the waveguide feeds confine electromagnetic waves so that they do not spread out in a spherical direction from antennas 104 and losses resulting therefrom are eliminated. In various embodiments, any number of waveguide feeds in transceiver modules 102 may be provisioned within the broad scope of the present disclosure. Electromagnetic waves radiated by transceiver module 102 toward reflector module 106 may be reflected outwards in particular directions by reflector module 106.

Reflectarray 116 comprising antennas 118 may be provisioned on a face of substrate 110. Plurality of RF IC dies 120 and another plurality of memory IC dies 122 may be provisioned on an opposing face of substrate 110, and coupled to substrate 110 and PCB 124 appropriately. In some embodiments, several antennas 118 may be coupled to a single one of RF IC die 120 and several RF IC dies 120 may be coupled to a single one of memory IC dies 122, so that the total number of IC dies may be much fewer than the number of antennas 118. Such a reduction in number of IC dies can enable larger scaling with more number of antennas 118 than can be accommodated by a configuration with a one-to-one correspondence between antennas 118 and RF IC dies 120.

Figure 15:
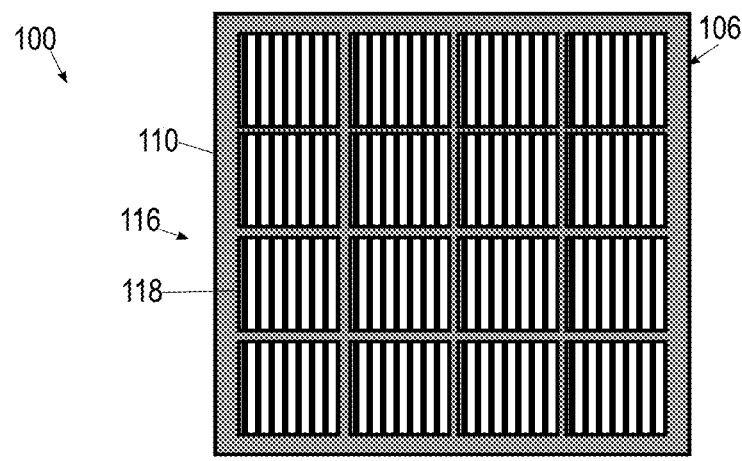
FIG. 15 is a schematic top view of a portion of an example microelectronic assembly according to some embodiments of the present disclosure.

FIG. 15 is a schematic top view of a portion of substrate 110 in an example microelectronic assembly 100 according to some embodiments of the present disclosure. Microelectronic assembly 100 may comprise a single reflector module 106 having a single substrate 110 housing all antennas 118 in microelectronic assembly 100. In such embodiments, substrate 110 may provide mechanical structural support for antennas 118 and pathways for communicative pathways 202 (and conductive traces 204 as appropriate). Any limitations on the size of such substrate 110 may arise from considerations of warpage, ease of handling and other factors unrelated to the particular application or functionality of microelectronic assembly 100.

Figure 16:
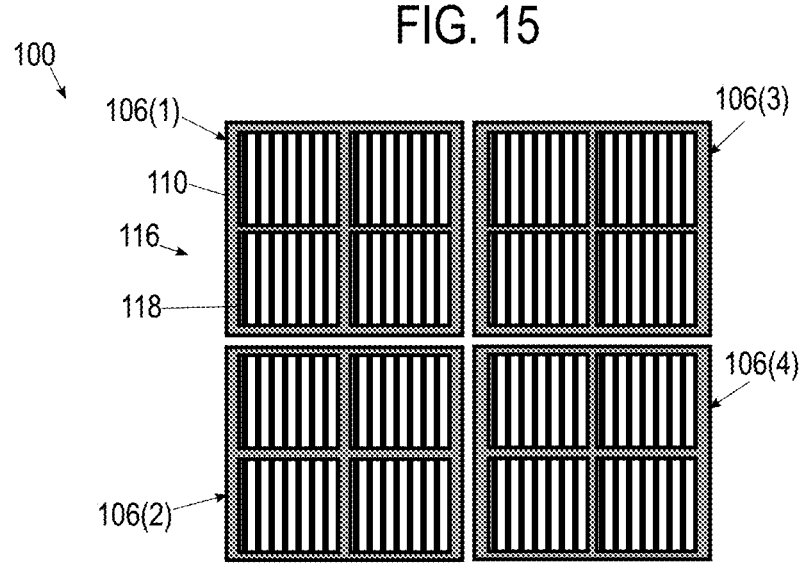
FIG. 16 is a schematic top view of a portion of an example microelectronic assembly according to some embodiments of the present disclosure.

FIG. 16 is a schematic top view of a portion of substrate 110 in an example microelectronic assembly 100 according to some embodiments of the present disclosure. Microelectronic assembly 100 may comprise a plurality of reflector modules 106, for example, 106(1)-106(4). Each reflector module 106 may comprise substrate 110 housing a subset of antennas 118 in microelectronic assembly 100. In such embodiments, each reflector module 106 may be aligned in functionality (e.g., for appropriately synchronized phase shifting) by a common baseband processor IC die 128 coupled by way of PCB 124 (not shown).

Figure 17:
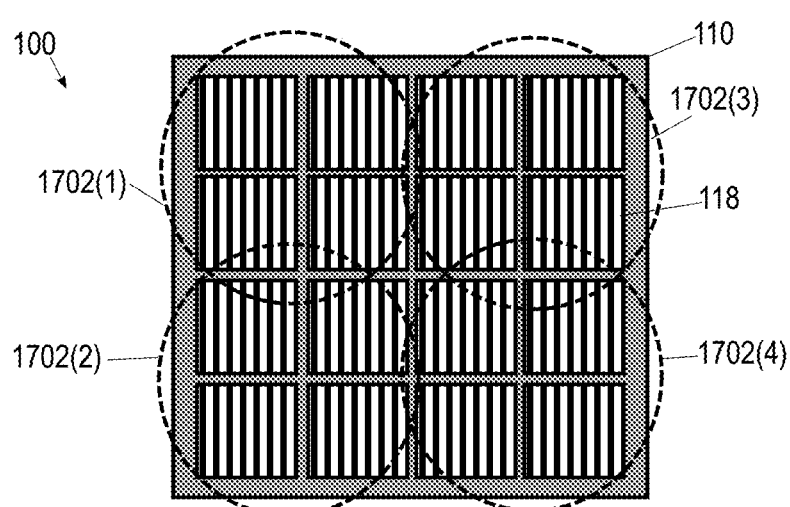
FIG. 17 is a schematic top view of a portion of an example microelectronic assembly according to some embodiments of the present disclosure.

FIG. 17 is a schematic top view of a portion of an example microelectronic assembly according to some embodiments of the present disclosure. A plurality of transceiver modules 102 (not shown) may illuminate respective areas of illumination 1702 of microelectronic assembly 100. For example, four transceiver modules 102 may illuminate respective areas of illumination 1702(1)-1702(4). Each area of illumination 1702(1)-1702(4) may cover a portion of antennas 118 such that all transceiver modules 102 together illuminate the entirety of antennas 118 in microelectronic assembly 100. Overlap between area of illumination 1702(1)-1702(4) may be configured appropriately (e.g., minimized) to ensure optimal efficiency of microelectronic assembly 100. The configuration of areas of illumination 1702(1)-1702(4) may be used by baseband processor IC die 128 to control the operation of RF IC die 120 appropriately; the areas of illumination 1702(1)-1702(4) may also inform values of phase states stored in the memory arrays of memory IC dies 122.

In some embodiments where microelectronic assembly 100 comprises a plurality of reflector modules 106, each reflector module 106 may be configured to be illuminated by a corresponding transceiver module 102 in the plurality of transceiver modules. In such embodiments, each area of illumination 1702 may illuminate a respective one of reflector modules 106. In other embodiments, each reflector module 106 may be configured to be illuminated by a plurality of transceiver modules 102; in yet other embodiments, each transceiver module 102 may illuminate a plurality of reflector modules 106.

Figure 18:
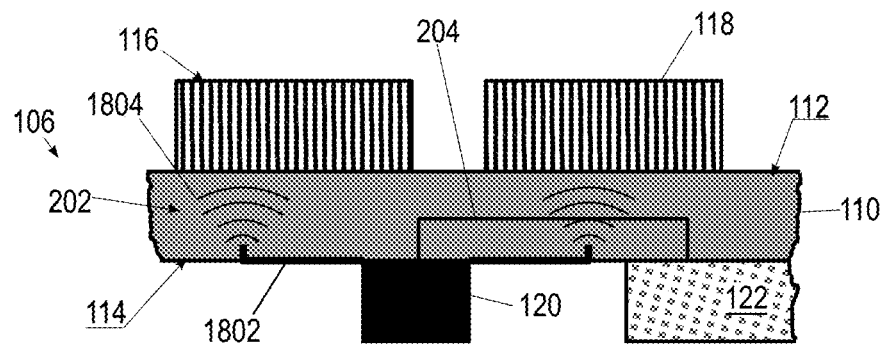
FIG. 18 is a schematic cross-sectional view of a portion of an example microelectronic assembly according to some embodiments of the present disclosure.

FIG. 18 is a schematic cross-sectional view of a portion of substrate 110 showing an example one of communicative pathway 202 in some embodiments. Communicative pathway 202 may comprise a conductive trace 1802 and a wireless connection 1804 extending between first side 112 and second side 114 of substrate 110, coupling antennas 118 with RF IC die 120. Conductive trace 1802 may operate as a short-range (e.g., near-field coupled structure) antenna configured to wirelessly communicate with antenna 118 through substrate 110, and may be of any suitable type or shape, such as F-type trace, straight trace, meandered trace, curved trace, circular trace, patch, slot-line, monopole, dipole, a waveguide, slotted waveguide, or a traveling wave structure. In some embodiments, conductive trace 1802 may comprise another antenna structure on RF IC die 120 (e.g., proximate to second side 114 of substrate 110), and antennas 118 may comprise parasitic patch antennas in such embodiments. The antenna structure in RF IC die 120 and antennas 118 may couple and resonate at a specific frequency, which can be configured to be the frequency of operation of reflectarray 116.

In some embodiments where communicative pathways 202 are wireless, irrespective of a location of RF IC die 120, a termination point of conductive trace 1802 may be in a shadow of the particular one of antenna 118 with which it is in communication. Conductive trace 1802 in such embodiments may comprise any electrically conductive material such as copper. Further, conductive trace 1802 may extend partially into substrate 110, or may be disposed on second side 114, as appropriate. Conductive trace 1802 may be conductively coupled to RF IC die 120 through substrate 110 or on second side 114 of substrate 110. In embodiments where multiple antennas 118 are coupled to a single RF IC die 120 (as shown), multiple conductive traces 1802 may extend from RF IC die 120 and terminate in the shadows of respective antennas 118 (e.g., in areas where projections of antennas 118 intersect second side 114 of substrate 110). In some embodiments, conductive traces 1802 may be also wirelessly coupled to RF IC die 120.

In such embodiments, RF IC die 120 may be coupled to memory IC die 122 by conductive traces 204 in any appropriate manner, taking into consideration any electrical performance issues on proximity to conductive traces 1802 and wireless connections 1804. In this figure and in the preceding and subsequent figures, although conductive trace 204 is shown as being inside substrate 110, in various embodiments, conductive trace 204 may be disposed on second side 114 of substrate 110, for example, by surface metallization processes.

Figure 19:
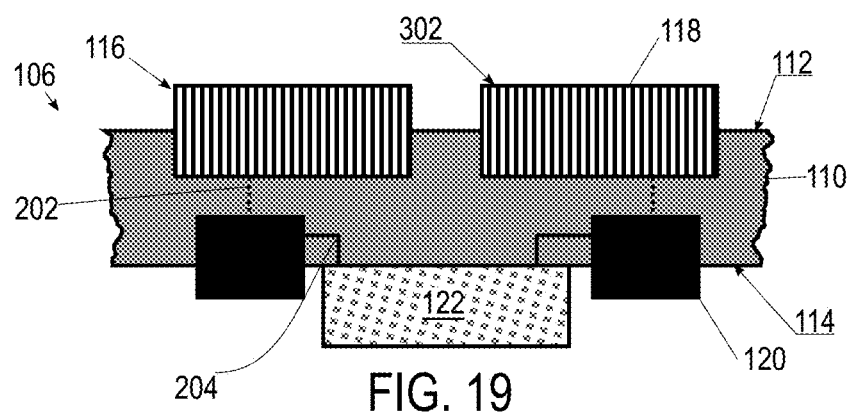
FIG. 19 is a schematic cross-sectional view of a portion of an example microelectronic assembly according to some embodiments of the present disclosure.

FIG. 19 is a schematic cross-sectional view of a portion of reflector module 106 in an example microelectronic assembly 100 according to some embodiments of the present disclosure. In the example embodiment shown, antennas 118 are partially embedded in substrate 110 such that surfaces 302 of antennas 118 (e.g., proximate to transceiver module 102) are not coplanar with first side 112 of substrate 110. RF IC die 120 may be embedded in substrate 110 in a blind cavity, for example, to reduce the distance between RF IC die 120 and antennas 118.

In various embodiments, any of the features discussed with reference to any of FIGS. 1-17 herein may be combined with any other features to form a package with one or more IC dies as described herein, for example, to form a modified microelectronic assembly 100. Some such combinations are described above, but, in various embodiments, further combinations and modifications are possible.

Example Methods

Figure 20:
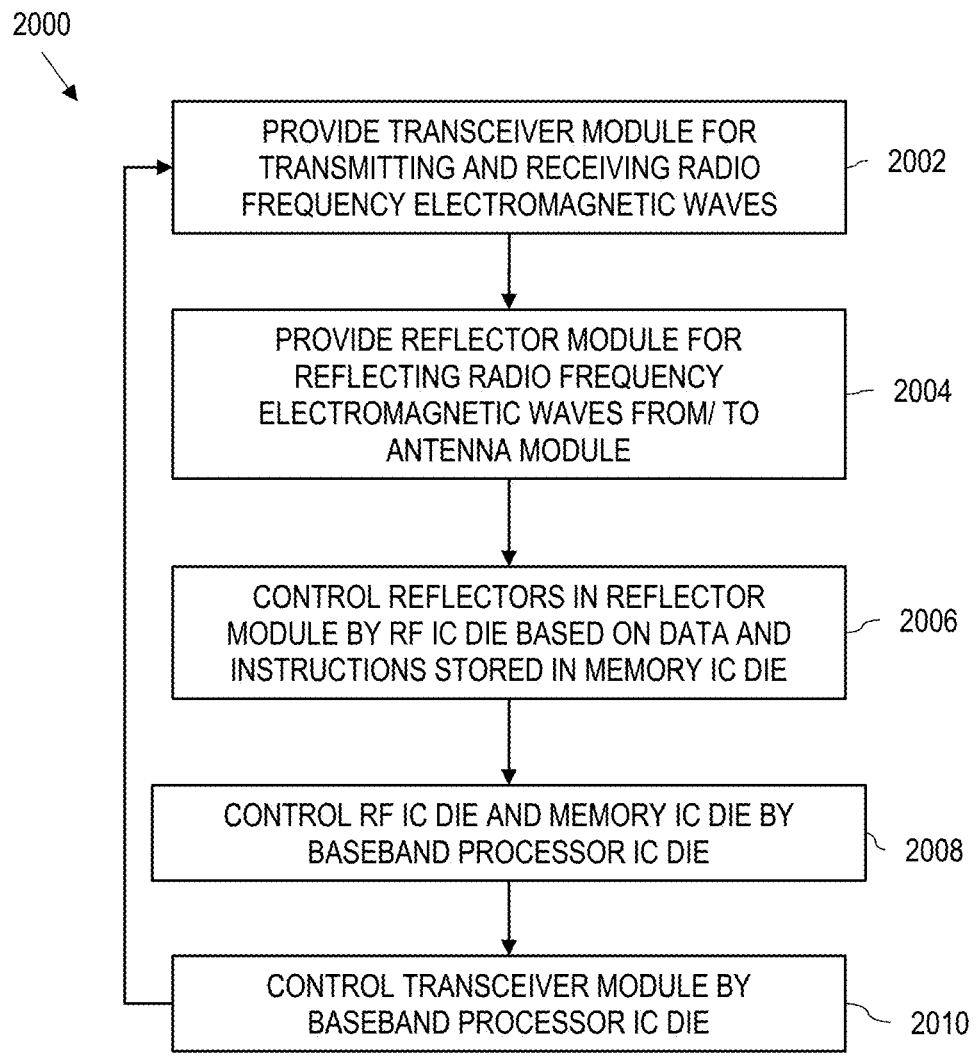
FIG. 20 is a schematic flow diagram illustrating certain operations associated with various embodiments of the microelectronic assembly of the present disclosure.

FIG. 20 is a schematic flow diagram illustrating certain operations 2000 associated with various embodiments of the microelectronic assembly of the present disclosure. At 2002, a plurality of transceiver modules 102 for transmitting and receiving RF electromagnetic waves may be provided. In some embodiments, the RF electromagnetic waves comprise a chirp signal. As is well known in the art, the chirp signal is a complex exponential signal comprising one or more pulses whose instantaneous frequency increases linearly; in other words, it is an analog waveform with linear frequency modulation. The chirped signal varies its frequency continuously throughout each of its pulses, thereby resulting in a higher-quality autocorrelation, permitting a single chirped pulse to acquire a larger range resolution than a comparable constant-frequency pulse.

At 2004, one or more reflector modules 106 for reflecting the RF electromagnetic waves may be provided. In various embodiments, reflector modules 106 may incorporate any one of the embodiments described in relation to previous figures. In particular, reflector modules 106 may comprise a plurality of reflectors on a first side 112 of substrate 110. As used herein, the term "reflector" encompasses an operational structure of antennas 118, wherein antennas 118 operate in conjunction with (or according to) instructions from RF IC die 120 to reflect the RF electromagnetic waves from transceiver modules 102.

At 2006, the reflectors comprising antennas 118 in the one or more reflector modules 106 may be controlled by one or more RF IC dies 120 based on data and instructions stored in one or more memory IC dies 122. Accordingly, the one or more reflector modules 106 may perform beamforming scanning for reflecting the RF electromagnetic waves. In various embodiments, the beamforming scanning comprises configuring, by a phase shifter in the one or more RF IC dies 120, the phase state of each reflector comprising antenna 118 in the one or more reflector modules 106. Each reflector comprising antenna 118 may correspond to a corresponding line in a memory array in the one or more memory IC dies 122. Each line in the memory array may comprise a phase state of the corresponding reflector. In some embodiments, each line in the memory array comprises one bit storing a value corresponding to one of two phase states. In other embodiments, each line in the memory array comprises two bits storing values corresponding to one of four phase states. A phase shifter in the one or more RF IC dies 120 reads the lines in the memory array in an ordered sequence. In some embodiments, RF IC die 120 may comprise another memory array that is smaller than the memory array of memory IC die 122. Data from the memory array in memory IC die 122 may be loaded periodically (e.g., asynchronously) into the smaller memory array in RF IC die 120. During operation, RF IC die 120 may read from the smaller memory array. Based on a value of the data in each line, the phase shifter configures the corresponding phase state of the associated reflector.

At 2008, the one or more RF IC dies 120 and the one or more memory IC dies 122 may be controlled by baseband processor IC die 128. Controlling the one or more RF IC dies 120 and memory IC dies 122 may comprise providing the data and instructions to be stored in the one or more memory IC dies 122. Further, baseband processor IC die 128 may control all correction and calibration procedures for the system (e.g., imaging system) in which microelectronic assembly 100 is used. At 2010, the plurality of transceiver modules 102 may be controlled by baseband processor IC die 128. Controlling the one or more transceiver modules 102 may comprise providing instructions to generate the RF electromagnetic waves, for example, the frequencies of the chirp signals. In various embodiments, additional operations may further comprise processing RF electromagnetic waves received at transceiver module 102 by baseband processor IC die 128 or transceiver modules 102. The processing may comprise extracting a target range of directions to generate a range Doppler map in each direction. As is well known in the art, the radar receivers at the one or more transceiver modules 102 may generate a range Doppler map by emitting a set of N coherent pulses (e.g., chirp signal), then correlating each pulse with that pulse's return using various mathematical techniques, such as Discrete Fourier Transform (DFT).

Although FIG. 20 illustrates various operations performed in a particular order, this is simply illustrative and the operations discussed herein may be reordered and/or repeated as suitable. Further, additional processes which are not illustrated may also be performed without departing from the scope of the present disclosure. Also, various ones of the operations discussed herein with respect to FIG. 20 may be modified in accordance with the present disclosure to fabricate others of microelectronic package 100 disclosed herein. Although the operations of the method 2000 are illustrated in FIG. 20 once each, the operations may be repeated as often as desired. For example, one or more operations may be performed in parallel to manufacture multiple microelectronic packages substantially simultaneously. In another example, the operations may be performed in a different order to reflect the structure of a particular microelectronic package in which one or more substrates 110 as described herein may be included.

Furthermore, the operations illustrated in FIG. 20 may be combined or may include more details than described. Still further, method 2000 may further include other manufacturing operations related to fabrication of other components of the microelectronic assemblies described herein, or any devices that may include the microelectronic assemblies as described herein. For example, method 2000 may include various cleaning operations, surface planarization operations (e.g., using chemical mechanical polishing (CMP)), operations for surface roughening, operations to include barrier and/or adhesion layers as desired, and/or operations for incorporating microelectronic packages as described herein in, or with, an IC component, a computing device, or any desired structure or device.

Example Devices and Components

Figure 21:
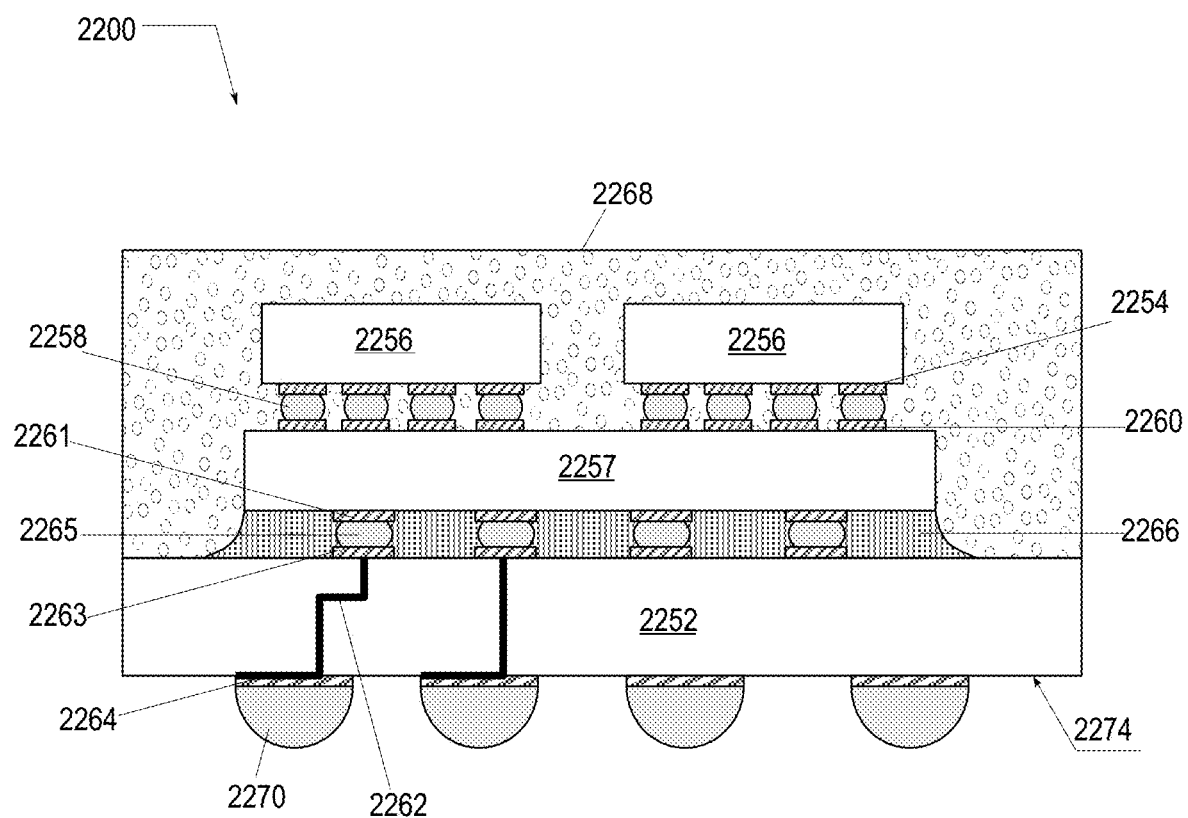
FIG. 21 is a cross-sectional view of a device package that includes one or more microelectronic assemblies in accordance with any of the embodiments disclosed herein.
Figure 22:
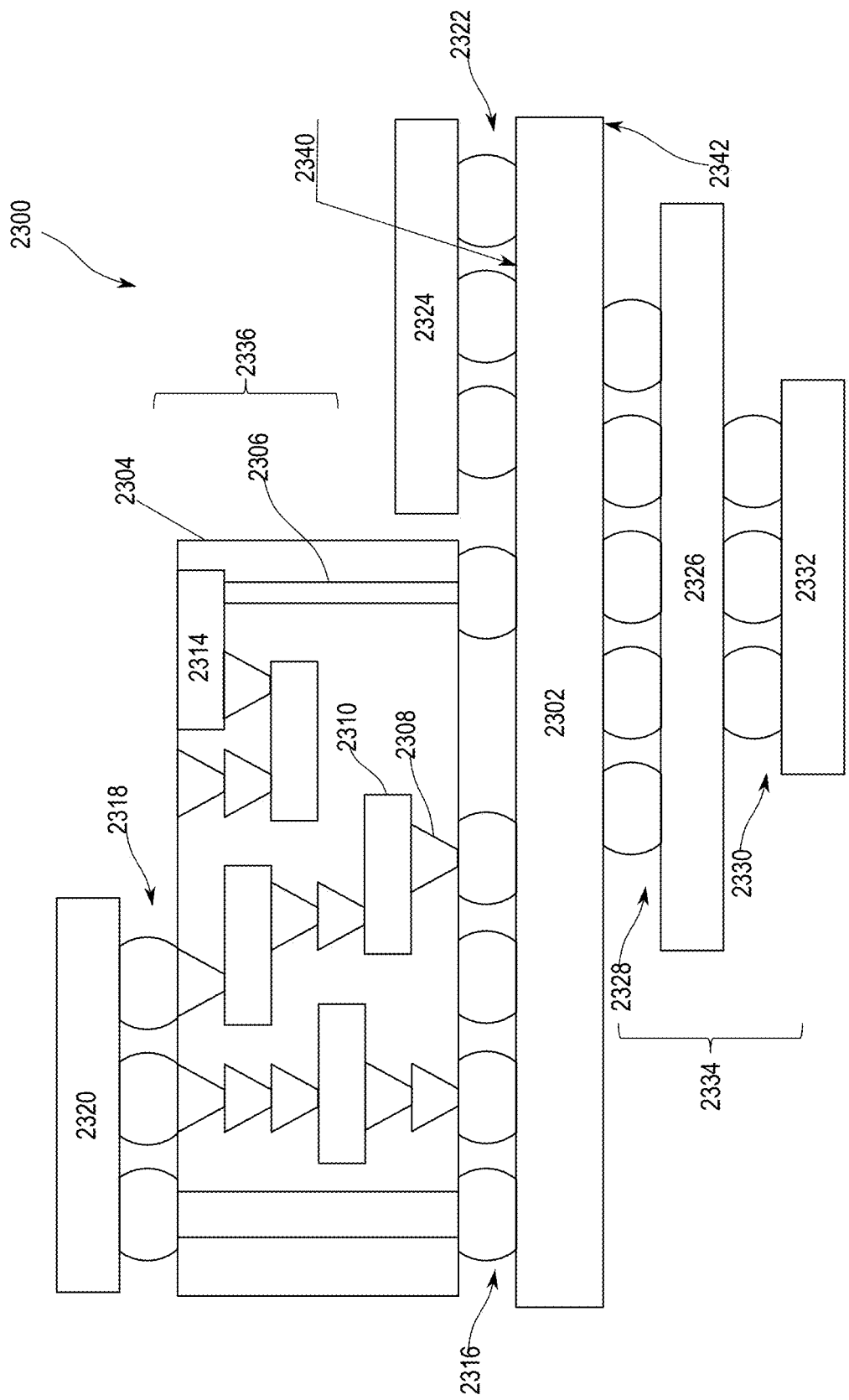
FIG. 22 is a cross-sectional side view of a device assembly that includes one or more microelectronic assemblies in accordance with any of the embodiments disclosed herein.
Figure 23:
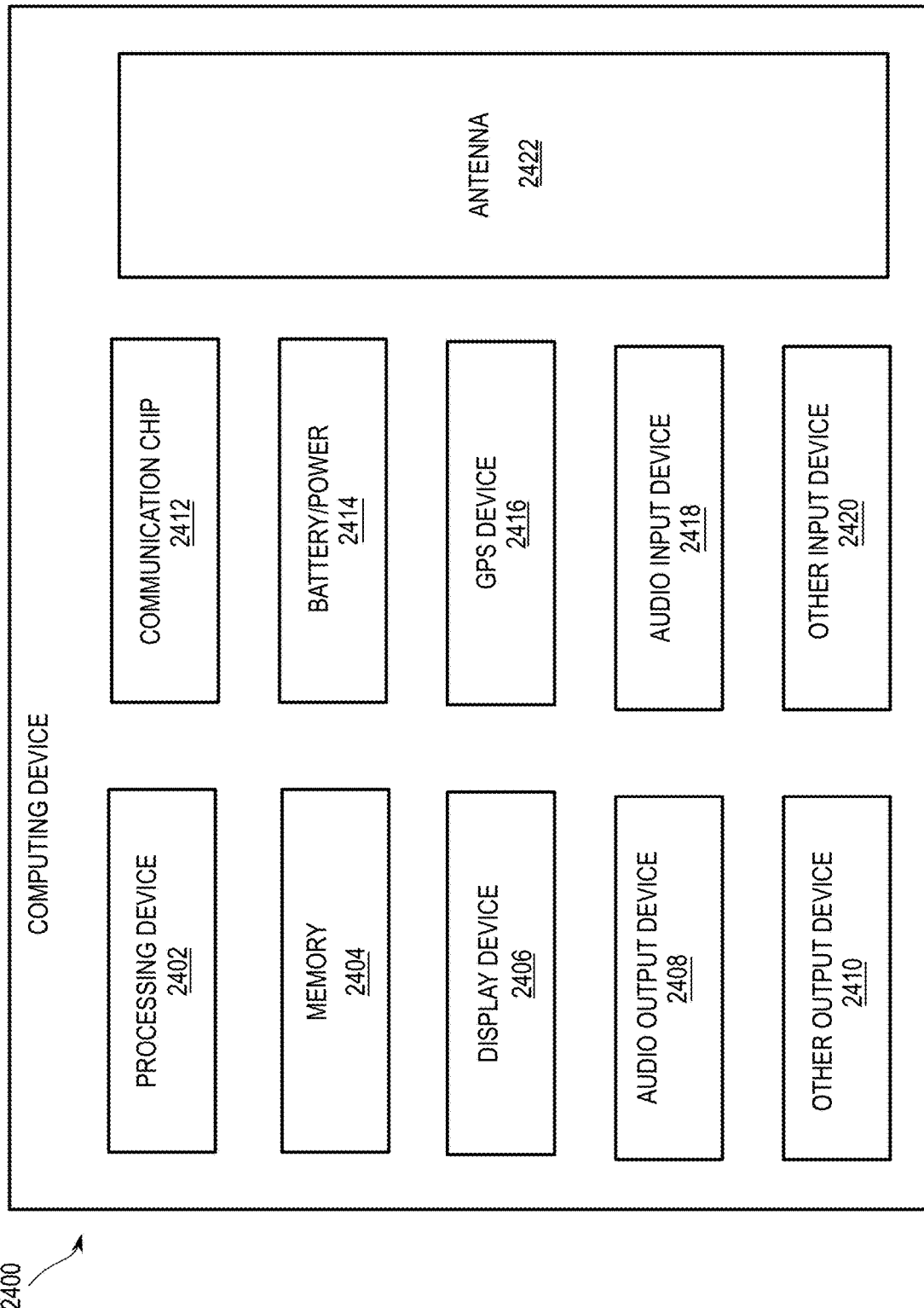
FIG. 23 is a block diagram of an example computing device that includes one or more microelectronic assemblies in accordance with any of the embodiments disclosed herein.

The packages disclosed herein, e.g., any of the embodiments shown in FIGS. 1-20 or any further embodiments described herein, may be included in any suitable electronic component. FIGS. 21-23 illustrate various examples of packages, assemblies, and devices that may be used with or include any of the IC packages as disclosed herein.

FIG. 21 is a side, cross-sectional view of an example IC package 2200 that may include IC packages in accordance with any of the embodiments disclosed herein. In some embodiments, the IC package 2200 may be a SiP.

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 22.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., HBM), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 22 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 21.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 21. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as RF devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 23 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 21). In yet another example, any one or more of the components of computing device 2400 may include an IC device assembly 2300 (e.g., as shown in FIG. 22).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single system-on-chip (SOC) die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

SELECT EXAMPLES

The following paragraphs provide various examples of the embodiments disclosed herein.

Example 1 provides a microelectronic assembly (e.g., 100), comprising (e.g., FIG. 1): a plurality of transceiver modules (e.g., 102), each transceiver module including a first antenna (e.g., 104); a PCB (e.g., 124); and a reflector module (e.g., 106) coupled to the PCB and separated from the plurality of transceiver modules by a space (e.g., 108), the reflector module comprising: a substrate (e.g., 110) having a first side (e.g., 112) and an opposing second side (e.g., 114), the first side being proximate to the plurality of transceiver modules, an antenna-array (e.g., 116) on the first side of the substrate, the antenna-array including a plurality of second antennas (e.g., 118); and a first IC die (e.g., 120) and a second IC die (e.g., 122) on the second side of the substrate, in which (e.g., FIG. 2): the PCB is coupled to the reflector module on the second side of the substrate, the second antennas are coupled to the first IC die by at least one of wired connections and wireless connections (e.g., 202) in the substrate (e.g., FIGS. 11, 12), the first IC die is coupled to the second IC die by conductive traces (e.g., 204) in the substrate, and transistors in the first IC die are larger than transistors in the second IC die.

Example 2 provides the microelectronic assembly of example 1, in which: transistors in the first IC die comprise RF switches configured to operate at electromagnetic frequencies between 20 kHz and 1 THz, and transistors in the second IC die comprise part of memory cell arrays and digital logic circuits.

Example 3 provides the microelectronic assembly of any of examples 1-2 (e.g., FIG. 1), further comprising a baseband processor IC die (e.g., 128) coupled to the PCB.

Example 4 provides the microelectronic assembly of example 3, in which the plurality of transceiver modules is conductively coupled to the baseband processor IC die.

Example 5 provides the microelectronic assembly of any of examples 1-4, in which the wired connections comprise conductive traces extending between the first side and the second side of the substrate, the conductive traces in contact with the plurality of second antennas and the first IC die.

Example 6 provides the microelectronic assembly of any of examples 1-4, in which the wireless connections comprise a plurality of conductive traces on the second side of the substrate in a shadow of the second antennas 118, the conductive traces not in contact with the second antennas.

Example 7 provides the microelectronic assembly of any of examples 1-5, in which the wired connections and the conductive traces comprise copper.

Example 8 provides the microelectronic assembly of any of examples 1-7, in which the first antenna comprises at least one of a patch antenna, a stacked patch antenna, a slot antenna, a leaky-wave antenna, a horn antenna, and a dipole/monopole antenna.

Example 9 provides the microelectronic assembly of any of examples 1-8, in which the second antenna comprises at least one of a patch antenna, a stacked patch antenna, a slot antenna, a leaky-wave antenna, a horn antenna, and a dipole/monopole antenna.

Example 10 provides the microelectronic assembly of any of examples 1-9, in which the first antenna is larger than the second antenna.

Example 11 provides the microelectronic assembly of any of examples 1-10, in which, during operation, the first antenna illuminates a subset of the plurality of second antennas such that all the first antennas together illuminate all the second antennas in the plurality of second antennas.

Example 12 provides the microelectronic assembly of any of examples 1-11, in which the space is half of another space in another microelectronic assembly, the another microelectronic assembly having a quarter number of the transceiver modules as the microelectronic assembly.

Example 13 provides the microelectronic assembly of any of examples 1-12, in which surfaces (e.g., 302) of the second antennas proximate to the plurality of transceiver modules are coplanar with the first side of the substrate (e.g., FIG. 3).

Example 14 provides the microelectronic assembly of any of examples 1-12, in which surfaces (e.g., 302) of the second antennas proximate to the plurality of transceiver modules extend away from the first side of the substrate (e.g., FIG. 2).

Example 15 provides the microelectronic assembly of any of examples 1-14, in which the reflector module further comprises a coating (e.g., 402) on the first side of the substrate (e.g., FIG. 4).

Example 16 provides the microelectronic assembly of example 15, in which the coating comprises epoxy transparent to RF electromagnetic waves.

Example 17 provides the microelectronic assembly of any of examples 15-16, further comprising shielding structures (e.g., 406) in the coating between the second antennas.

Example 18 provides the microelectronic assembly of any of examples 15-17, in which the coating is over the plurality of second antennas such that a surface (e.g., 404) of the coating is between the plurality of transceiver modules and the plurality of second antennas (e.g., FIG. 4).

Example 19 provides the microelectronic assembly of any of examples 15-17, in which a surface (e.g., 404) of the coating is coplanar with surfaces of the plurality of second antennas proximate to the plurality of transceiver modules (e.g., FIG. 5).

Example 20 provides the microelectronic assembly of any of examples 1-12, in which the plurality of second antennas is embedded in the substrate such that a portion of each second antenna is within the substrate and another portion of each second antenna is outside the substrate (e.g., FIG. 5).

Example 21 provides the microelectronic assembly of any of examples 1-20, further comprising a plurality of the first IC dies (e.g., FIGS. 1-12).

Example 22 provides the microelectronic assembly of example 21, in which each second antenna is coupled to a separate first IC die in the plurality of first IC dies (e.g., FIGS. 2-5, 7, 9).

Example 23 provides the microelectronic assembly of any of examples 21-22, in which each first IC die in the plurality of first IC dies is coupled to the second IC die by separate conductive traces (e.g., FIGS. 6-8).

Example 24 provides the microelectronic assembly of any of examples 21 or 23, in which the plurality of second antennas comprises subsets of the second antennas, each subset being coupled to a separate first IC die in the plurality of first IC dies (e.g., FIG. 11).

Example 25 provides the microelectronic assembly of any of examples 21-24, further comprising a plurality of second IC dies (e.g., FIGS. 6, 9-10).

Example 26 provides the microelectronic assembly of example 25, in which the plurality of first IC dies comprises subsets of the first IC dies, each subset being coupled to a separate second IC die in the plurality of second IC dies (e.g., FIG. 6).

Example 27 provides the microelectronic assembly of example 25, in which each first IC die in the plurality of first IC dies is coupled to a separate second IC die in the plurality of second IC dies (e.g., FIG. 10).

Example 28 provides the microelectronic assembly of any of examples 25-27, in which a plurality of the first IC dies and the plurality of the second IC dies are packaged together in a single package (e.g., 1300, FIG. 13).

Example 29 provides the microelectronic assembly of example 28, in which: the reflector module is coupled to the PCB by interconnects, and a thickness of the single package is smaller than a thickness of the interconnects between the reflector module and the PCB.

Example 30 provides the microelectronic assembly of any of examples 1-29, in which: the reflector module is coupled to the PCB by interconnects, and the interconnects are solder-based interconnects.

Example 31 provides the microelectronic assembly of any of examples 1-30, in which: the RF IC die and the memory IC die are coupled to the substrate by first interconnects having a first pitch between adjacent ones of the first interconnects, the reflector module is coupled to the PCB by second interconnects having a second pitch between adjacent ones of the second interconnects, and the first pitch is smaller than the second pitch.

Example 32 provides the microelectronic assembly of any of examples 1-31, in which the substrate comprises one of glass, ceramic, and organic dielectric material.

Example 33 provides the microelectronic assembly of any of examples 1-32, further comprising a plurality of reflector modules (e.g., FIGS. 1, 16, 17).

Example 34 provides the microelectronic assembly of example 33, in which each reflector module is configured to be illuminated by a corresponding transceiver module in the plurality of transceiver modules (e.g., FIG. 17).

Example 35 provides a RF reflector module, comprising: a substrate (e.g., 110) having a first side (e.g., 112) and an opposing second side (e.g., 114); a antenna-array (e.g., 116) on the first side, the antenna-array including a plurality of antennas (e.g., 118); an RF IC die (e.g., 120) on the second side, the RF IC die comprising RF switches; and a memory IC die (e.g., 122) on the second side, the memory IC die comprising memory cells, in which (e.g., FIG. 2): antennas in the plurality of antennas are coupled to the RF IC die by at least one of wired connections and wireless connections (e.g., 202) in the substrate (e.g., FIGS. 11, 12), and the RF IC die is coupled to the memory IC die by conductive traces (e.g., 204) in the substrate.

Example 36 provides the RF reflector module of example 35, in which the substrate comprises one of glass, ceramic, and organic dielectric material.

Example 37 provides the RF reflector module of any of examples 35-36, in which the RF IC die and the memory IC die are coupled to the second side by interconnects.

Example 38 provides the RF reflector module of any of examples 35-37, in which the RF reflector module is coupled to a PCB on the second side.

Example 39 provides the RF reflector module of example 38, in which a plurality of RF reflector modules is coupled to the PCB.

Example 40 provides the RF reflector module of any of examples 35-39, further comprising a plurality of RF IC dies.

Example 41 provides the RF reflector module of example 40, in which each antenna in the plurality of antennas is coupled to a separate RF IC die in the plurality of RF IC dies.

Example 42 provides the RF reflector module of example 40, in which the plurality of antennas comprises subsets of antennas, each subset of antennas being coupled to a separate RF IC die in the plurality of RF IC dies.

Example 43 provides the RF reflector module of any of examples 40-42, in which the plurality of RF IC dies is packaged within a single package.

Example 44 provides the RF reflector module of example 43, in which the RF IC dies are stacked within the single package.

Example 45 provides the RF reflector module of any of examples 40-44, further comprising a plurality of memory IC dies.

Example 46 provides the RF reflector module of example 45, in which each RF IC die in the plurality of RF IC dies is coupled to a separate memory IC die in the plurality of memory IC dies.

Example 47 provides the RF reflector module of any of examples 40-46, in which the plurality of RF IC dies comprises subsets of RF IC dies, each subset of RF IC dies being coupled to a separate memory IC die in the plurality of memory IC dies.

Example 48 provides the RF reflector module of any of examples 45-47, in which the plurality of memory IC dies are packaged within a single package.

Example 49 provides the RF reflector module of example 48, in which the memory IC dies are stacked within the single package.

Example 50 provides the RF reflector module of example 48, in which the plurality of memory IC dies are packaged together with the plurality of RF IC dies in a single package.

Example 51 provides a method (e.g., 2000) for operating a RF reflector array, comprising: providing a transceiver module for transmitting and receiving RF electromagnetic waves (e.g., 2002); providing a reflector module for reflecting the RF electromagnetic waves, in which the reflector module comprises a plurality of reflectors on a first side of a substrate (e.g., 2004); controlling reflectors in the reflector module by a first IC die based on data and instructions stored in a second IC die, in which the first IC die and the second IC die are on a second side of the substrate (e.g., 2006); controlling the first IC die and the second IC die by a baseband processor IC die (e.g., 2008); and controlling the transceiver module by the baseband processor IC die (e.g., 2010).

Example 52 provides the method of example 51, in which the reflector module performs beamforming scanning for reflecting the RF electromagnetic waves, the beamforming scanning comprising configuring, by a phase shifter in the first IC die, a phase state of each reflector in the reflector module.

Example 53 provides the method of example 52, in which: each reflector corresponds to a corresponding line in a memory array in the second IC die, each line comprises the phase state of the corresponding reflector, a phase shifter in the first IC die reads the lines in the memory array in an ordered sequence, and based on a value of the data in each line, the phase shifter configures the corresponding phase state of the corresponding reflector.

Example 54 provides the method of example 53, in which each line in the memory array comprises one bit storing a value corresponding to one of two phase states.

Example 55 provides the method of example 53, in which each line in the memory array comprises two bits storing values corresponding to one of four phase states.

Example 56 provides the method of any of examples 51-55, in which the RF electromagnetic waves comprise a chirp signal.

Example 57 provides the method of any of examples 51-56, controlling the first IC die and the second IC die comprises providing the data and instructions to be stored in the second IC die.

Example 58 provides the method of any of examples 51-57, controlling the transceiver module comprises providing instructions to generate the RF electromagnetic waves.

Example 59 provides the method of any of examples 51-58, further comprising processing RF electromagnetic waves received at the transceiver module.

Example 60 provides the method of example 59, in which the processing comprises: extracting a target range of directions to generate a range Doppler map in each direction.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:
a plurality of transceiver modules, each transceiver module including a first antenna;
a printed circuit board (PCB); and
a reflector module coupled to the PCB and separated from the plurality of transceiver modules by a space, the reflector module comprising:
a substrate having a first side and an opposing second side, the first side being proximate to the plurality of transceiver modules,
an antenna array on the first side of the substrate, the antenna array including a plurality of second antennas; and
a first integrated circuit (IC) die and a second IC die on the second side of the substrate,
wherein:
the PCB is coupled to the reflector module on the second side of the substrate,
the second antennas are coupled to the first IC die by at least one of wired connections and wireless connections in the substrate,
the first IC die is coupled to the second IC die by conductive traces in the substrate, and transistors in the first IC die are larger than transistors in the second IC die.

2. The microelectronic assembly of claim 1, wherein the wired connections comprise conductive traces extending between the first side and the second side of the substrate, the conductive traces in contact with the plurality of second antennas and the first IC die.

3. The microelectronic assembly of claim 1, wherein the wireless connections comprise a plurality of conductive traces on the second side of the substrate in a shadow of the second antennas, the conductive traces not in contact with the second antennas.

4. The microelectronic assembly of claim 1, wherein the reflector module further comprises a coating on the first side of the substrate.

5. The microelectronic assembly of claim 1, further comprising a plurality of the first IC dies.

6. The microelectronic assembly of claim 5, wherein each second antenna is coupled to a separate first IC die in the plurality of first IC dies.

7. The microelectronic assembly of claim 5, wherein the plurality of second antennas comprises subsets of the second antennas, each subset being coupled to a separate first IC die in the plurality of first IC dies.

8. The microelectronic assembly of claim 5, further comprising a plurality of second IC dies.

9. The microelectronic assembly of claim 8, wherein a plurality of the first IC dies and the plurality of the second IC dies are packaged together in a single package.

10. The microelectronic assembly of claim 1, wherein the substrate comprises one of glass, ceramic, and organic dielectric material.

11. An integrated circuit (IC) package, comprising:
a component; and
a microelectronic assembly coupled to the component, wherein the microelectronic assembly includes:
a plurality of transceiver modules, each transceiver module including a first antenna;
a printed circuit board (PCB); and
a reflector module coupled to the PCB and separated from the plurality of transceiver modules by a space, the reflector module comprising:
a substrate having a first side and an opposing second side, the first side being proximate to the plurality of transceiver modules, and
an antenna array on the first side of the substrate, the antenna array including a plurality of second antennas; and
a first integrated circuit (IC) die and a second IC die on the second side of the substrate,
wherein:
the PCB is coupled to the reflector module on the second side of the substrate,
the second antennas are coupled to the first IC die by connections in the substrate,
the first IC die is coupled to the second IC die by conductive traces in the substrate, and
transistors in the first IC die are larger than transistors in the second IC die.

12. The IC package of claim 11, wherein the component is a package substrate.

13. The IC package of claim 11, wherein the component is an interposer.

14. The IC package of claim 11, wherein the component is a circuit board.

15. The IC package of claim 11, further comprising an insulator material at least partially enclosing the microelectronic assembly.

16. The IC package of claim 11, further comprising interconnects to couple the microelectronic assembly and the component.

17. The IC package of claim 16, wherein the interconnects are solder balls.

18. A computing device, comprising:
 a processing device; and
 an antenna coupled to the processing device, the antenna comprising a microelectronic assembly, wherein the microelectronic assembly includes:
  a plurality of transceiver modules, each transceiver module including a first antenna;
  a printed circuit board (PCB); and
  a reflector module separated from the plurality of transceiver modules by a space, the reflector module comprising:
   a substrate having a first side and an opposing second side, the first side being proximate to the plurality of transceiver modules, and
   an antenna array on the first side of the substrate, the antenna array including a plurality of second antennas; and
  a first integrated circuit (IC) die and a second IC die on the second side of the substrate,
 wherein:
  the PCB is coupled to the reflector module on the second side of the substrate,
  the second antennas are coupled to the first IC die by at least one of wired connections and wireless connections in the substrate,
  the first IC die is coupled to the second IC die by conductive traces in the substrate, and footprints of transistors in the first IC die are larger than footprints of transistors in the second IC die.

19. The computing device of claim 18, further comprising a display device.

20. The computing device of claim 18, further comprising battery or power circuitry.

\* \* \* \* \*